(12) United States Patent
Shaheen et al.

(10) Patent No.: US 8,084,818 B2
(45) Date of Patent: Dec. 27, 2011

(54) HIGH MOBILITY TRI-GATE DEVICES AND METHODS OF FABRICATION

(75) Inventors: Mohamad A. Shaheen, Portland, OR (US); Brian Doyle, Portland, OR (US); Suman Dutta, Beaverton, OR (US); Robert S. Chau, Beaverton, OR (US); Peter Tolchinksy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/332,189

(22) Filed: Jan. 12, 2006

(65) Prior Publication Data
US 2010/0065888 A1   Mar. 18, 2010

Related U.S. Application Data

(62) Division of application No. 10/883,183, filed on Jun. 30, 2004, now Pat. No. 7,042,009.

(51) Int. Cl.
*H01L 27/12* (2006.01)
(52) U.S. Cl. . 257/347; 257/368; 257/627; 257/E23.179; 257/E29.004
(58) Field of Classification Search ............... 257/64, 257/74, 255, 347, 368, 627, 797, E23.179, 257/E29.004; 438/198
See application file for complete search history.

(56) References Cited

U.S. PATENT DOCUMENTS

| | | |
|---|---|---|
| 3,387,820 A | 6/1968 | Sanderfer et al. |
| 4,231,149 A | 11/1980 | Chapman et al. |
| 4,487,652 A | 12/1984 | Almgren |
| 4,711,701 A | 12/1987 | McLevige |
| 4,818,715 A | 4/1989 | Chao |
| 4,905,063 A | 2/1990 | Beltram et al. |
| 4,906,589 A | 3/1990 | Chao |
| 4,907,048 A | 3/1990 | Huang |
| 4,994,873 A | 2/1991 | Madan |

(Continued)

FOREIGN PATENT DOCUMENTS

DE   102 03 998 A1   8/2003

(Continued)

OTHER PUBLICATIONS

Chang, S.T, et al.: "3-D Simulation of Strained S/SiGe heterojunction FinFets", Semiconductor Device Research Symposium, 2003 International Dec. 10-12, 2003. Piscataway, NJ, USA, IEEE, Dec. 2003, pp. 176-177.

(Continued)

*Primary Examiner* — Tuan N. Quach
(74) *Attorney, Agent, or Firm* — Blakely, Sokoloff, Taylor & Zafman LLP

(57) ABSTRACT

A high mobility semiconductor assembly. In one exemplary aspect, the high mobility semiconductor assembly includes a first substrate having a first reference orientation located at a <110> crystal plane location on the first substrate and a second substrate formed on top of the first substrate. The second substrate has a second reference orientation located at a <100> crystal plane location on the second substrate, wherein the first reference orientation is aligned with the second reference orientation. In another exemplary aspect, the second substrate has a second reference orientation located at a <110> crystal plane location on the second substrate, wherein the second substrate is formed over the first substrate with the second reference orientation being offset to the first reference orientation by about 45 degrees.

8 Claims, 16 Drawing Sheets

U.S. PATENT DOCUMENTS

| | | | |
|---|---|---|---|
| 4,996,574 A | 2/1991 | Shirasaki | |
| 5,023,203 A | 6/1991 | Choi | |
| 5,120,666 A | 6/1992 | Gotou | |
| 5,124,777 A | 6/1992 | Lee | 257/532 |
| 5,179,037 A | 1/1993 | Seabaugh | |
| 5,216,271 A | 6/1993 | Takagi et al. | |
| 5,218,213 A | 6/1993 | Gaul et al. | |
| 5,278,012 A | 1/1994 | Yamanaka et al. | |
| 5,278,102 A | 1/1994 | Horie | |
| 5,308,999 A | 5/1994 | Gotou | |
| 5,328,810 A | 7/1994 | Lowrey et al. | |
| 5,338,959 A | 8/1994 | Kim et al. | |
| 5,346,836 A | 9/1994 | Manning et al. | |
| 5,346,839 A | 9/1994 | Sundaresan | |
| 5,357,119 A | 10/1994 | Wang et al. | |
| 5,391,506 A | 2/1995 | Tada et al. | |
| 5,428,237 A | 6/1995 | Yuzurihara et al. | |
| 5,466,621 A | 11/1995 | Hisamoto et al. | |
| 5,475,869 A | 12/1995 | Gomi et al. | |
| 5,479,033 A | 12/1995 | Baca et al. | |
| 5,482,877 A | 1/1996 | Rhee | |
| 5,514,885 A | 5/1996 | Myrick | |
| 5,521,859 A | 5/1996 | Ema et al. | |
| 5,539,229 A | 7/1996 | Noble, Jr et al. | |
| 5,543,351 A | 8/1996 | Yoshihiko et al. | |
| 5,545,586 A | 8/1996 | Koh | |
| 5,563,077 A | 10/1996 | Ha | |
| 5,576,227 A | 11/1996 | Hsu | |
| 5,578,513 A | 11/1996 | Maegawa | |
| 5,595,919 A | 1/1997 | Pan | |
| 5,595,941 A | 1/1997 | Okamoto et al. | |
| 5,652,454 A | 7/1997 | Iwamatsu et al. | |
| 5,658,806 A | 8/1997 | Lin et al. | |
| 5,665,203 A | 9/1997 | Lee et al. | |
| 5,682,048 A | 10/1997 | Shinohara et al. | |
| 5,698,869 A | 12/1997 | Yoshimi et al. | |
| 5,701,016 A | 12/1997 | Burroughes et al. | 257/24 |
| 5,716,879 A | 2/1998 | Choi et al. | |
| 5,739,544 A | 4/1998 | Koichiro et al. | |
| 5,760,442 A | 6/1998 | Shigyo et al. | |
| 5,770,513 A | 6/1998 | Okaniwa | |
| 5,773,331 A | 6/1998 | Solomon et al. | |
| 5,776,821 A | 7/1998 | Haskell et al. | |
| 5,793,088 A | 8/1998 | Choi et al. | |
| 5,804,848 A | 9/1998 | Mukai | |
| 5,811,324 A | 9/1998 | Yang | |
| 5,814,895 A | 9/1998 | Hirayama | |
| 5,821,629 A | 10/1998 | Wen et al. | |
| 5,827,769 A | 10/1998 | Aminzadeh et al. | |
| 5,844,278 A | 12/1998 | Mizuno et al. | |
| 5,856,225 A | 1/1999 | Lee et al. | |
| 5,859,456 A | 1/1999 | Efland et al. | |
| 5,880,015 A | 3/1999 | Hata | |
| 5,888,309 A | 3/1999 | Yu | |
| 5,889,304 A | 3/1999 | Watanabe et al. | |
| 5,899,710 A | 5/1999 | Mukai | |
| 5,905,285 A | 5/1999 | Gardner et al. | |
| 5,908,313 A | 6/1999 | Chau et al. | |
| 5,952,701 A | 9/1999 | Bulucea et al. | |
| 5,965,914 A | 10/1999 | Miyamoto | |
| 5,976,767 A | 11/1999 | Li | |
| 5,985,726 A | 11/1999 | Yu et al. | |
| 6,013,926 A | 1/2000 | Oku et al. | |
| 6,018,176 A | 1/2000 | Lim | |
| 6,031,249 A | 2/2000 | Yamazaki et al. | |
| 6,051,452 A | 4/2000 | Shigyo et al. | |
| 6,054,355 A | 4/2000 | Inumiya et al. | |
| 6,063,675 A | 5/2000 | Rodder | |
| 6,063,677 A | 5/2000 | Rodder et al. | |
| 6,066,869 A | 5/2000 | Noble et al. | |
| 6,087,208 A | 7/2000 | Krivokapic et al. | |
| 6,093,621 A | 7/2000 | Tseng | |
| 6,114,201 A | 9/2000 | Wu | |
| 6,114,206 A | 9/2000 | Yu | |
| 6,117,741 A | 9/2000 | Chatterjee et al. | |
| 6,120,846 A | 9/2000 | Hintermaier et al. | |
| 6,130,123 A | 10/2000 | Liang et al. | |
| 6,144,072 A | 11/2000 | Iwamatsu et al. | |
| 6,150,222 A | 11/2000 | Gardner et al. | |
| 6,153,485 A | 11/2000 | Pey et al. | |
| 6,159,808 A | 12/2000 | Chuang | |
| 6,163,053 A | 12/2000 | Kawashima | |
| 6,165,880 A | 12/2000 | Yaung et al. | |
| 6,174,820 B1 | 1/2001 | Habermehl et al. | |
| 6,190,975 B1 | 2/2001 | Kubo et al. | |
| 6,200,865 B1 | 3/2001 | Gardner et al. | |
| 6,218,309 B1 | 4/2001 | Miller et al. | |
| 6,251,729 B1 | 6/2001 | Montree et al. | |
| 6,251,751 B1 | 6/2001 | Chu et al. | |
| 6,251,763 B1 | 6/2001 | Inumiya et al. | |
| 6,252,284 B1 | 6/2001 | Muller et al. | |
| 6,259,135 B1 | 7/2001 | Hsu et al. | |
| 6,261,921 B1 | 7/2001 | Yen et al. | |
| 6,262,456 B1 | 7/2001 | Yu et al. | |
| 6,274,503 B1 | 8/2001 | Hsieh | |
| 6,287,924 B1 | 9/2001 | Chau et al. | |
| 6,294,416 B1 | 9/2001 | Wu | |
| 6,307,235 B1 | 10/2001 | Forbes et al. | |
| 6,310,367 B1 | 10/2001 | Yagishita et al. | |
| 6,317,444 B1 | 11/2001 | Chakrabarti et al. | |
| 6,319,807 B1 | 11/2001 | Yeh et al. | |
| 6,335,251 B2 | 1/2002 | Miyano et al. | |
| 6,358,800 B1 | 3/2002 | Tseng | |
| 6,359,311 B1 | 3/2002 | Colinge et al. | |
| 6,362,111 B1 | 3/2002 | Laaksonen et al. | |
| 6,368,923 B1 | 4/2002 | Huang | |
| 6,376,317 B1 | 4/2002 | Forbes et al. | |
| 6,383,882 B1 | 5/2002 | Lee et al. | |
| 6,387,820 B1 | 5/2002 | Sanderfer | |
| 6,391,782 B1 | 5/2002 | Yu | |
| 6,396,108 B1 | 5/2002 | Krivokapic et al. | |
| 6,399,970 B2 | 6/2002 | Kubo et al. | |
| 6,403,434 B1 | 6/2002 | Yu | |
| 6,403,981 B1 | 6/2002 | Yu | |
| 6,407,442 B2 | 6/2002 | Inoue et al. | |
| 6,410,371 B1 | 6/2002 | Yu et al. | |
| 6,413,802 B1 | 7/2002 | Hu et al. | |
| 6,413,877 B1 | 7/2002 | Annapragada | |
| 6,424,015 B1 | 7/2002 | Ishibashi et al. | |
| 6,437,550 B2 | 8/2002 | Andoh et al. | |
| 6,457,890 B1 | 10/2002 | Kohlruss et al. | |
| 6,458,662 B1 | 10/2002 | Yu | |
| 6,459,123 B1 | 10/2002 | Enders et al. | |
| 6,465,290 B1 | 10/2002 | Suguro et al. | |
| 6,466,621 B1 | 10/2002 | Hisamoto et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,479,866 B1 | 11/2002 | Xiang | |
| 6,483,146 B2 | 11/2002 | Lee | |
| 6,483,151 B2 | 11/2002 | Wakabayashi et al. | |
| 6,483,156 B1 | 11/2002 | Adkisson et al. | |
| 6,495,403 B1 | 12/2002 | Skotnicki et al. | |
| 6,498,096 B2 | 12/2002 | Bruce et al. | |
| 6,500,767 B2 | 12/2002 | Chiou et al. | |
| 6,501,141 B1 | 12/2002 | Leu | |
| 6,506,692 B2 | 1/2003 | Andideh | |
| 6,515,339 B2 | 2/2003 | Shin et al. | |
| 6,525,403 B2 | 2/2003 | Inaba et al. | |
| 6,526,996 B1 | 3/2003 | Chang et al. | |
| 6,534,807 B2 | 3/2003 | Mandelman et al. | |
| 6,537,862 B2 | 3/2003 | Song | |
| 6,537,885 B1 | 3/2003 | Kang et al. | |
| 6,537,901 B2 | 3/2003 | Cha et al. | |
| 6,541,829 B2 | 4/2003 | Nishinohara et al. | |
| 6,555,879 B1 | 4/2003 | Krivokapic et al. | |
| 6,562,665 B1 | 5/2003 | Yu | |
| 6,562,687 B1 | 5/2003 | Deleonibus | |
| 6,566,734 B2 | 5/2003 | Sugihara et al. | |
| 6,583,469 B1 | 6/2003 | Fried et al. | |
| 6,605,498 B1 | 8/2003 | Murthy et al. | |
| 6,610,576 B2 | 8/2003 | Nowak | |
| 6,611,029 B1 | 8/2003 | Ahmed et al. | |
| 6,630,388 B2 | 10/2003 | Sekigawa et al. | |
| 6,635,909 B2 | 10/2003 | Clark et al. | |
| 6,642,090 B1 | 11/2003 | Fried et al. | |
| 6,642,114 B2 | 11/2003 | Nakamura | |

| | | | |
|---|---|---|---|
| 6,645,797 B1 | 11/2003 | Buynoski et al. | |
| 6,645,826 B2 | 11/2003 | Yamazaki et al. | |
| 6,645,861 B2 | 11/2003 | Cabral et al. | |
| 6,656,853 B2 | 12/2003 | Ito | |
| 6,657,259 B2 | 12/2003 | Fried et al. | |
| 6,660,598 B2 | 12/2003 | Hanafi et al. | |
| 6,664,160 B2 | 12/2003 | Park et al. | |
| 6,680,240 B1 | 1/2004 | Maszara | |
| 6,686,231 B1 | 2/2004 | Ahmed et al. | |
| 6,689,650 B2 | 2/2004 | Gambino et al. | |
| 6,693,324 B2 | 2/2004 | Maegawa et al. | |
| 6,696,366 B1 | 2/2004 | Morey et al. | |
| 6,706,571 B1 | 3/2004 | Yu et al. | |
| 6,709,982 B1 | 3/2004 | Buynoski et al. | |
| 6,713,396 B2 | 3/2004 | Anthony | |
| 6,716,684 B1 | 4/2004 | Krivokapic et al. | |
| 6,716,686 B1 | 4/2004 | Buynoski et al. | |
| 6,716,690 B1 | 4/2004 | Wang et al. | |
| 6,730,964 B2 | 5/2004 | Horiuchi | |
| 6,744,103 B2 | 6/2004 | Snyder | |
| 6,756,657 B1 | 6/2004 | Zhang et al. | 257/627 |
| 6,762,469 B2 | 7/2004 | Mocuta et al. | |
| 6,764,884 B1 | 7/2004 | Yu et al. | |
| 6,770,516 B2 | 8/2004 | Wu et al. | |
| 6,774,390 B2 | 8/2004 | Sugiyama et al. | |
| 6,780,694 B2 | 8/2004 | Doris et al. | |
| 6,784,071 B2 * | 8/2004 | Chen et al. | 438/401 |
| 6,784,076 B2 | 8/2004 | Gonzalez et al. | |
| 6,787,402 B1 | 9/2004 | Yu | |
| 6,787,406 B1 | 9/2004 | Hill et al. | |
| 6,787,439 B2 | 9/2004 | Ahmed et al. | |
| 6,787,845 B2 | 9/2004 | Deleonibus | |
| 6,787,854 B1 | 9/2004 | Yang et al. | |
| 6,790,733 B1 | 9/2004 | Natzle et al. | |
| 6,794,313 B1 | 9/2004 | Chang | |
| 6,794,718 B2 * | 9/2004 | Nowak et al. | 257/347 |
| 6,798,000 B2 | 9/2004 | Luyken et al. | |
| 6,800,885 B1 | 10/2004 | An et al. | |
| 6,800,910 B2 | 10/2004 | Lin et al. | |
| 6,803,631 B2 | 10/2004 | Dakshina-Murthy et al. | |
| 6,812,075 B2 | 11/2004 | Fried et al. | |
| 6,812,111 B2 | 11/2004 | Cheong et al. | |
| 6,815,277 B2 | 11/2004 | Fried et al. | |
| 6,821,834 B2 | 11/2004 | Ando | |
| 6,825,506 B2 | 11/2004 | Chau et al. | |
| 6,830,998 B1 | 12/2004 | Pan et al. | |
| 6,831,310 B1 | 12/2004 | Matthew et al. | |
| 6,833,588 B2 | 12/2004 | Yu et al. | |
| 6,835,614 B2 | 12/2004 | Hanafi et al. | |
| 6,835,618 B1 | 12/2004 | Dakshina-Murthy et al. | |
| 6,838,322 B2 | 1/2005 | Pham et al. | |
| 6,844,238 B2 | 1/2005 | Yeo et al. | |
| 6,849,556 B2 | 2/2005 | Takahashi | |
| 6,849,884 B2 | 2/2005 | Clark et al. | |
| 6,852,559 B2 | 2/2005 | Kwak et al. | |
| 6,855,588 B1 | 2/2005 | Liao et al. | |
| 6,855,606 B2 | 2/2005 | Chen et al. | |
| 6,855,990 B2 | 2/2005 | Yeo et al. | |
| 6,858,472 B2 | 2/2005 | Schoenfeld | |
| 6,858,478 B2 | 2/2005 | Chau et al. | |
| 6,864,519 B2 | 3/2005 | Yeo et al. | |
| 6,864,540 B1 | 3/2005 | Divakaruni et al. | |
| 6,867,433 B2 | 3/2005 | Yeo et al. | |
| 6,867,460 B1 | 3/2005 | Anderson et al. | |
| 6,869,868 B2 | 3/2005 | Chiu et al. | |
| 6,870,226 B2 * | 3/2005 | Maeda et al. | 257/347 |
| 6,881,635 B1 | 4/2005 | Chidambarrao et al. | |
| 6,884,154 B2 | 4/2005 | Mizushima et al. | 451/44 |
| 6,885,055 B2 | 4/2005 | Lee | |
| 6,888,199 B2 | 5/2005 | Nowak et al. | |
| 6,890,811 B2 | 5/2005 | Hou et al. | |
| 6,891,234 B1 | 5/2005 | Connelly et al. | |
| 6,897,527 B2 | 5/2005 | Dakshina-Murthy et al. | |
| 6,902,947 B2 | 6/2005 | Chinn et al. | |
| 6,902,962 B2 | 6/2005 | Yeo et al. | |
| 6,909,147 B2 | 6/2005 | Aller et al. | |
| 6,909,151 B2 | 6/2005 | Hareland et al. | |
| 6,919,238 B2 | 7/2005 | Bohr | |
| 6,921,691 B1 | 7/2005 | Li et al. | |
| 6,921,702 B2 | 7/2005 | Joshi et al. | |
| 6,921,963 B2 | 7/2005 | Krivokapic et al. | |
| 6,921,982 B2 | 7/2005 | Joshi et al. | |
| 6,924,190 B2 | 8/2005 | Dennison | |
| 6,946,377 B2 | 9/2005 | Chambers | |
| 6,955,961 B1 | 10/2005 | Chung | |
| 6,955,969 B2 | 10/2005 | Djomehri et al. | |
| 6,960,517 B2 | 11/2005 | Rios et al. | |
| 6,967,351 B2 | 11/2005 | Fried et al. | |
| 6,969,878 B2 | 11/2005 | Coronel et al. | |
| 6,970,373 B2 | 11/2005 | Datta et al. | |
| 6,974,738 B2 | 12/2005 | Hareland | |
| 6,975,014 B1 | 12/2005 | Krivokapic et al. | |
| 6,977,415 B2 | 12/2005 | Matsuo | |
| 6,997,415 B2 | 12/2005 | Matsuo | |
| 6,998,301 B1 | 2/2006 | Yu et al. | |
| 6,998,318 B2 | 2/2006 | Park | |
| 7,013,447 B2 | 3/2006 | Mathew et al. | |
| 7,018,551 B2 | 3/2006 | Beintner et al. | |
| 7,045,401 B2 | 5/2006 | Lee et al. | |
| 7,045,407 B2 | 5/2006 | Keating et al. | |
| 7,045,441 B2 | 5/2006 | Chang et al. | |
| 7,045,451 B2 | 5/2006 | Chang et al. | |
| 7,056,794 B2 | 6/2006 | Ku et al. | |
| 7,060,539 B2 | 6/2006 | Chidambarrao et al. | |
| 7,061,055 B2 | 6/2006 | Sekigawa et al. | |
| 7,071,064 B2 | 7/2006 | Doyle et al. | |
| 7,074,623 B2 | 7/2006 | Lochtefeld et al. | |
| 7,074,656 B2 | 7/2006 | Yeo | |
| 7,074,662 B2 | 7/2006 | Yeo et al. | |
| 7,084,018 B1 | 8/2006 | Ahmed et al. | |
| 7,105,390 B2 | 9/2006 | Brask et al. | |
| 7,105,891 B2 | 9/2006 | Visokay | |
| 7,105,894 B2 | 9/2006 | Yeo et al. | |
| 7,105,934 B2 | 9/2006 | Anderson et al. | |
| 7,112,478 B2 | 9/2006 | Grupp et al. | |
| 7,115,945 B2 | 10/2006 | Lee et al. | |
| 7,115,954 B2 | 10/2006 | Shimizu et al. | |
| 7,119,402 B2 | 10/2006 | Kinoshita et al. | |
| 7,122,463 B2 | 10/2006 | Ohuchi | |
| 7,132,360 B2 | 11/2006 | Schaefer et al. | |
| 7,138,320 B2 | 11/2006 | Bentum et al. | |
| 7,141,480 B2 | 11/2006 | Adam et al. | |
| 7,141,856 B2 | 11/2006 | Lee et al. | |
| 7,154,118 B2 | 12/2006 | Lindert | |
| 7,163,851 B2 | 1/2007 | Abadeer et al. | |
| 7,163,898 B2 | 1/2007 | Mariani et al. | |
| 7,172,943 B2 | 2/2007 | Yeo et al. | |
| 7,183,137 B2 | 2/2007 | Lee et al. | |
| 7,187,043 B2 | 3/2007 | Arai et al. | |
| 7,196,372 B1 | 3/2007 | Yu et al. | |
| 7,214,991 B2 | 5/2007 | Yeo et al. | |
| 7,238,564 B2 | 7/2007 | Ko et al. | |
| 7,241,653 B2 | 7/2007 | Hareland et al. | |
| 7,247,547 B2 | 7/2007 | Zhu et al. | |
| 7,247,578 B2 | 7/2007 | Brask | |
| 7,250,367 B2 | 7/2007 | Vaartstra et al. | |
| 7,250,645 B1 | 7/2007 | Wang et al. | |
| 7,250,655 B2 | 7/2007 | Bae et al. | |
| 7,256,455 B2 | 8/2007 | Ahmed et al. | |
| 7,268,024 B2 | 9/2007 | Yeo et al. | |
| 7,268,058 B2 | 9/2007 | Chau et al. | |
| 7,291,886 B2 * | 11/2007 | Doris et al. | 257/350 |
| 7,297,600 B2 | 11/2007 | Oh et al. | |
| 7,304,336 B2 | 12/2007 | Cheng et al. | |
| 7,323,710 B2 | 1/2008 | Kim et al. | |
| 7,326,634 B2 | 2/2008 | Lindert et al. | |
| 7,329,913 B2 | 2/2008 | Brask et al. | |
| 7,339,241 B2 | 3/2008 | Orlowski et al. | |
| 7,348,284 B2 | 3/2008 | Doyle et al. | |
| 7,348,642 B2 | 3/2008 | Nowak | |
| 7,354,817 B2 | 4/2008 | Wantanabe et al. | |
| 7,358,121 B2 | 4/2008 | Chau et al. | |
| 7,385,262 B2 | 6/2008 | O'Keefee et al. | |
| 7,396,730 B2 | 7/2008 | Li | |
| 7,452,778 B2 | 11/2008 | Chen et al. | |
| 7,456,471 B2 | 11/2008 | Anderson et al. | |
| 7,456,476 B2 | 11/2008 | Hareland et al. | |
| 7,479,421 B2 | 1/2009 | Kavalieros et al. | |

| Patent/Publication | Date | Name |
|---|---|---|
| 7,585,734 B2 | 9/2009 | Kang et al. |
| 7,612,416 B2 | 11/2009 | Takeuchi et al. |
| 7,655,989 B2 | 2/2010 | Zhu et al. |
| 7,701,018 B2 | 4/2010 | Yamagami et al. |
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim et al. |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino et al. |
| 2003/0067017 A1 | 4/2003 | Ieong et al. |
| 2003/0085194 A1 | 5/2003 | Hopkins, Jr. ..................... 216/2 |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Toshihiro et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0186167 A1 | 10/2003 | Johnson, Jr. et al. |
| 2003/0190766 A1 | 10/2003 | Gonzalez et al. |
| 2003/0201458 A1 | 10/2003 | Clark et al. |
| 2003/0203636 A1 | 10/2003 | Hieda |
| 2003/0227036 A1 | 12/2003 | Sugiyama et al. |
| 2004/0016968 A1 | 1/2004 | Coronel et al. |
| 2004/0029323 A1 | 2/2004 | Shimizu et al. |
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |
| 2004/0061178 A1 | 4/2004 | Lin et al. |
| 2004/0063286 A1 | 4/2004 | Kim et al. |
| 2004/0070020 A1 | 4/2004 | Fujiwara et al. |
| 2004/0075149 A1 | 4/2004 | Fitzgerald et al. |
| 2004/0082125 A1 | 4/2004 | Hou et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1 | 5/2004 | Yeo et al. |
| 2004/0099966 A1 | 5/2004 | Chau et al. |
| 2004/0108523 A1 | 6/2004 | Chen et al. |
| 2004/0108558 A1 | 6/2004 | Kwak et al. |
| 2004/0110097 A1 | 6/2004 | Ahmed et al. |
| 2004/0113181 A1 | 6/2004 | Wicker |
| 2004/0119100 A1 | 6/2004 | Nowak et al. |
| 2004/0124492 A1 | 7/2004 | Matsuo |
| 2004/0126975 A1 | 7/2004 | Ahmed et al. |
| 2004/0132236 A1 | 7/2004 | Doris et al. |
| 2004/0132567 A1 | 7/2004 | Schonnenbeck |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0169221 A1 | 9/2004 | Ko et al. |
| 2004/0169269 A1 | 9/2004 | Yeo et al. |
| 2004/0173815 A1 | 9/2004 | Yeo et al. |
| 2004/0173846 A1 | 9/2004 | Hergenrother et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0197975 A1 | 10/2004 | Krivokapic et al. |
| 2004/0198003 A1 | 10/2004 | Yeo et al. |
| 2004/0203254 A1 | 10/2004 | Conley et al. |
| 2004/0209463 A1 | 10/2004 | Kim et al. |
| 2004/0217420 A1 | 11/2004 | Yeo et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0253792 A1 | 12/2004 | Cohen et al. |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0017377 A1 | 1/2005 | Joshi et al. |
| 2005/0019993 A1 | 1/2005 | Lee |
| 2005/0020020 A1 | 1/2005 | Collaert et al. |
| 2005/0035391 A1 | 2/2005 | Lee et al. |
| 2005/0035415 A1 | 2/2005 | Yeo et al. |
| 2005/0040444 A1 | 2/2005 | Cohen |
| 2005/0059214 A1 | 3/2005 | Cheng et al. |
| 2005/0073060 A1 | 4/2005 | Datta et al. |
| 2005/0093028 A1 | 5/2005 | Chambers |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0104096 A1 | 5/2005 | Lee et al. |
| 2005/0110082 A1 | 5/2005 | Cheng |
| 2005/0116289 A1 | 6/2005 | Boyd et al. |
| 2005/0118790 A1 | 6/2005 | Lee et al. ..................... 438/460 |
| 2005/0127362 A1 | 6/2005 | Zhang et al. |
| 2005/0127632 A1 | 6/2005 | Gehre |
| 2005/0133829 A1 | 6/2005 | Kunii et al. |
| 2005/0133866 A1 | 6/2005 | Chau et al. |
| 2005/0136584 A1 | 6/2005 | Boyanov |
| 2005/0139860 A1 | 6/2005 | Snyder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161739 A1 | 7/2005 | Anderson et al. |
| 2005/0162928 A1 | 7/2005 | Rosmeulen |
| 2005/0167766 A1 | 8/2005 | Yagishita |
| 2005/0170593 A1 | 8/2005 | Kang et al. |
| 2005/0184316 A1 | 8/2005 | Kim et al. |
| 2005/0189583 A1 | 9/2005 | Kim et al. |
| 2005/0191795 A1 | 9/2005 | Chidambarrao et al. |
| 2005/0199919 A1 | 9/2005 | Liu |
| 2005/0202604 A1 | 9/2005 | Cheng et al. |
| 2005/0215014 A1 | 9/2005 | Ahn et al. |
| 2005/0215022 A1 | 9/2005 | Adam et al. |
| 2005/0224797 A1 | 10/2005 | Ko et al. ..................... 257/64 |
| 2005/0224798 A1 | 10/2005 | Buss |
| 2005/0224800 A1 | 10/2005 | Lindert et al. |
| 2005/0227498 A1 | 10/2005 | Furukawa et al. |
| 2005/0230763 A1 | 10/2005 | Huang et al. |
| 2005/0233156 A1 | 10/2005 | Senzaki |
| 2005/0239252 A1 | 10/2005 | Ahn et al. |
| 2005/0255642 A1 | 11/2005 | Liu |
| 2005/0266645 A1 | 12/2005 | Park |
| 2005/0272192 A1 | 12/2005 | Oh et al. |
| 2005/0277294 A1 | 12/2005 | Schaeffer et al. |
| 2005/0280121 A1* | 12/2005 | Doris et al. ..................... 257/629 |
| 2006/0014338 A1 | 1/2006 | Doris et al. |
| 2006/0040054 A1 | 2/2006 | Pearlstein et al. |
| 2006/0043500 A1 | 3/2006 | Chen et al. |
| 2006/0046521 A1 | 3/2006 | Vaartstra et al. |
| 2006/0063469 A1 | 3/2006 | Talieh et al. |
| 2006/0068590 A1 | 3/2006 | Lindert et al. |

| | | | |
|---|---|---|---|
| 2006/0068591 A1 | 3/2006 | Radosavljevic et al. | |
| 2006/0071299 A1 | 4/2006 | Doyle et al. | |
| 2006/0086977 A1 | 4/2006 | Shah et al. | |
| 2006/0138548 A1 | 6/2006 | Richards et al. | |
| 2006/0154478 A1 | 7/2006 | Hsu et al. | |
| 2006/0170066 A1 | 8/2006 | Mathew et al. | |
| 2006/0172479 A1 | 8/2006 | Furukawa et al. | |
| 2006/0172480 A1 | 8/2006 | Wang et al. | |
| 2006/0172497 A1 | 8/2006 | Hareland et al. | |
| 2006/0180859 A1 | 8/2006 | Radosavljevic et al. | |
| 2006/0202270 A1 | 9/2006 | Son et al. | |
| 2006/0204898 A1 | 9/2006 | Gutsche et al. | |
| 2006/0205164 A1 | 9/2006 | Ko et al. | |
| 2006/0211184 A1 | 9/2006 | Boyd et al. | |
| 2006/0220131 A1 | 10/2006 | Kinoshita et al. | |
| 2006/0227595 A1 | 10/2006 | Chuang et al. | |
| 2006/0240622 A1 | 10/2006 | Lee et al. | |
| 2006/0244066 A1 | 11/2006 | Yeo et al. | |
| 2006/0263699 A1 | 11/2006 | Abatchev et al. | |
| 2006/0281325 A1 | 12/2006 | Chou et al. | |
| 2007/0001219 A1 | 1/2007 | Radosavljevic et al. | |
| 2007/0023795 A1 | 2/2007 | Nagano et al. | |
| 2007/0029624 A1 | 2/2007 | Nowak | |
| 2007/0045735 A1 | 3/2007 | Orlowski et al. | |
| 2007/0045748 A1 | 3/2007 | Booth et al. | |
| 2007/0048930 A1 | 3/2007 | Figura et al. | |
| 2007/0052041 A1 | 3/2007 | Sorada et al. | |
| 2007/0093010 A1 | 4/2007 | Matthew et al. | |
| 2007/0108514 A1 | 5/2007 | Inoue et al. | |
| 2007/0187682 A1 | 8/2007 | Takeuchi et al. | |
| 2007/0241414 A1 | 10/2007 | Narihiro | |
| 2007/0262389 A1 | 11/2007 | Chau et al. | |
| 2008/0017890 A1 | 1/2008 | Yuan et al. | |
| 2008/0017934 A1 | 1/2008 | Kim et al. | |
| 2008/0111163 A1 | 5/2008 | Russ et al. | |
| 2008/0116515 A1 | 5/2008 | Gossner et al. | |
| 2008/0128797 A1 | 6/2008 | Dyer et al. | |
| 2008/0212392 A1 | 9/2008 | Bauer | |
| 2008/0237655 A1 | 10/2008 | Nakabayashi et al. | |
| 2008/0258207 A1 | 10/2008 | Radosavljevic et al. | |
| 2009/0061572 A1 | 3/2009 | Hareland et al. | |
| 2009/0099181 A1 | 4/2009 | Wurster et al. | |
| 2010/0200923 A1 | 8/2010 | Chen et al. | |

FOREIGN PATENT DOCUMENTS

| | | |
|---|---|---|
| EP | 0510667 | 10/1992 |
| EP | 0 623 963 A1 | 11/1994 |
| EP | 1091413 | 4/2001 |
| EP | 1 202 335 A2 | 5/2002 |
| EP | 1 566 844 A2 | 8/2005 |
| GB | 2 156 149 | 10/1985 |
| JP | 56073454 | 6/1981 |
| JP | 59 145538 A | 8/1984 |
| JP | 02-303048 A | 12/1990 |
| JP | 06005856 | 1/1994 |
| JP | 6151387 | 5/1994 |
| JP | 06177089 | 6/1994 |
| JP | 06224440 | 8/1994 |
| JP | 7-50421 | 2/1995 |
| JP | 9162301 | 6/1997 |
| JP | 200037842 | 2/2000 |
| JP | 2001-189453 | 7/2001 |
| JP | 2001338987 | 12/2001 |
| JP | 2002-298051 | 10/2002 |
| JP | 2002-110977 | 12/2002 |
| JP | 2003 298051 | 10/2003 |
| JP | 2003-298051 | 10/2003 |
| KR | 0222363 | 10/1999 |
| TW | 200414538 | 8/1992 |
| TW | 200518310 | 11/1998 |
| TW | 508669 | 11/2002 |
| TW | 516232 | 1/2003 |
| TW | 561530 | 1/2003 |
| TW | 546713 | 8/2003 |
| TW | 548799 | 8/2003 |
| TW | 200402872 | 2/2004 |
| TW | 200405408 | 4/2004 |
| TW | 591798 | 6/2004 |
| TW | 594990 | 6/2004 |
| TW | 200414539 | 8/2004 |
| TW | 200417034 | 9/2004 |
| TW | I223449 | 11/2004 |
| TW | I231994 | 5/2005 |
| TW | I238524 | 8/2005 |
| TW | I239102 | 9/2005 |
| WO | WO 02/43151 A | 5/2002 |
| WO | WO 02/095814 | 11/2002 |
| WO | WO 03/003442 | 1/2003 |
| WO | WO 2006/007350 | 1/2003 |
| WO | WO 2004/059726 A1 | 7/2004 |
| WO | WO 2005/034212 | 4/2005 |
| WO | WO 2005/036651 | 4/2005 |
| WO | WO 2005/098963 | 10/2005 |
| WO | WO 2006/078469 | 7/2006 |
| WO | WO 2007/002426 | 1/2007 |
| WO | WO 2007/041152 | 4/2007 |

OTHER PUBLICATIONS

Burenkov, A, et al.: "Corner effect in Double and Triple Gate FinFETs", European Solid-State Device Research 2003, 33$^{rd}$ Conference on. ESSDERC,Sep. 16, 2003 pp. 135-138.

PCT International Search Report for PCT Application No. PCT/US 2005/010505. Mailed on Aug. 8, 2005. (24 pages).

PCT Int'l Search Report for Int'l. Application No. PCT/US2005/020339, Filing Date, Jun. 9, 2005, mailed Oct. 4, 2005. (6 pages).

T. Park, et al., Fabrication-of-Body-Tied FinFETs (Omega MOSFETs) Using Bulk Si Wafers. [This work was in part supported by Tera Level Nanodevices Project of MOST in 2002] (2 pages), (2002).

V. Subramanian et al., "A Bulk-Si-Compatible Ultrathin-body SOI Technology for Sub-100m MOSFETS" Proceeding of the 57th Annual Device Research Conference, pp. 28-29 (1999).

Hisamoto et al., "A Folded-channel MOSFET for Deepsub-tenth Micron Era", 1998 IEEE International Electron Device Meeting Technica Digest, pp. 1032-1034 (1998).

Huang et al., "Sub 50-nm FinFET: PMOS", 1999 IEEE International Electron Device Meeting Technical Digest, pp. 67-70 (1999).

Auth et al., "Vertical, Fully-Depleted, Surroundings Gate MOSFETS on sub-0.1um Thick Silicon Pillars", 1996 54th Annual Device Research Conference Digest, pp. 108-109 (1996).

Hisamoto et al., "A Fully Depleted Lean-Channel Transistor (DELTA)—A Novel Vertical Ultrathin SOI MOSFET", IEEE Electron Device Letters, V. 11(1), pp. 36-38 (1990).

Jong-Tae Park et al., "Pi-Gate SOI MOSFET" IEEE Electron Device Letters, vol. 22, No. 8, Aug. 2001, pp. 405-406.

Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.

International Search Report PCT/US 03/26242, Jan. 26, 2004.
International Search Report PCT/US 03/39727, Apr. 29, 2004.
International Search Report PCT/US 03/40320, Jun. 4, 2004.
International Search Report PCT/US2005/000947, May 6, 2005.
International Search Report PCT/US2005/033439, Feb. 2, 2006.
International Search Report PCT/US2005/035380, Feb. 2, 2006.
International Search Report PCT/US2005/037169, Feb. 28, 2006.
International Search Report PCT/US2004/032442, Jun. 22, 2005.
International Search Report and Written Opinion PCT/US2006/000378, May 26, 2006.
International Search Report PCT/US2006/024516, Jan. 23, 2007.
International Search Report PCT/US2006/037643, Jan. 26, 2007.

Sung Min Kim, et al., A Novel Multi-channel Field Effect Transistor (McFET) on Bulk Si for High Performance Sub-80nm Application, IEDM 04-639, 2004 IEEE, pp. 27.4.1-27.4.4.

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire FinFET" 2004 Symposium on VLSI Technology Digest of Technical Papers, 2004 IEEE, pp. 196-197.
T. M. Mayer, et al., "Chemical Vapor Deposition of Fluoroalkylsilane Monolayer Films for Adhesion Control in Microelectromechanical Systems" 2000 American Vacuum Society B 18(5), Sep.-Oct. 2000, pp. 2433-2440.
Jing Guo et al. "Performance Projections for Ballistic Carbon Nanotube Field-Effect Transistors" Applied Physics Letters, vol. 80, No. 17, Apr. 29, 2002, pp. 3192-2194.
Ali Javey et al., "High-K Dielectrics for Advanced Carbon-Nanotube Transistors and Logic Gates", Advance Online Publication, Published online, Nov. 17, 2002, pp. 1-6.
Richard Martel et al., "Carbon Nanotube Field Effect Transistors for Logic Applications" IBM, T.J. Watson Research Center, 2001 IEEE, IEDM 01, pp. 159-162, (2001).
David M. Fried et al., "Improved Independent Gate N-Type FinFET Fabrication and Characterization", IEEE Electron Device Letters, vol. 24, No. 9, Sep. 2003, pp. 592-594.
David M. Fried et al., "Improved Independent Gate P-Type Independent-Gate FinFETs", IEEE Electron Device Letters, vol. 25, No. 4, Apr. 2004, pp. 199-201.
Charles Kuo et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.
Charles Kuo et al., "A Capacitorless Double-Gate DRAM Cell Design for High Density Applications", 2002 IEEE International Electron Devices Meeting Technical Digest, Dec. 2002, pp. 843-846.
Takashi Ohsawa et al., "Memory Design Using a One-Transistor Gain Cell on SOI", IEEE Journal of Solid-State Circuits, vol. 37, No. 11, Nov. 2002, pp. 1510-1522.
T. Tanaka et al., Scalability Study on a Capacitorless 1T-DRAM: From Single-Gate PD-SOI to Double-Gate FinDram, 2004 IEEE International Electron Devices Meeting Technical Digest, Dec. 2004, (4 pgs.).
B. Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.
R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).
T. Ludwig et al., "FinFET Technology for Future Microprocessors" 2003 IEEE, pp. 33-34.
Peter A. Stolk et al. "Modeling Statistical Dopant Fluctuations in MOS Transistors", 1998 IEEE, IEEE Transactions on Electron Devices, vol. 45, No. 9, Sep. 1998, pp. 1960-1971.
Evert Seevinck et al., "Static-Noise Margin Analysis of MOS SRAM Cells" 1987 IEEE, IEEE Journals of Solid-State Circuits, vol. SC-22, No. 5, Oct. 1987.
Yang-Kyu Choi et al. "Sub-20nm CMOS FinFET Technologies", IEEE 2001, IEDM 01-421 to 01-424.
M. Ieong et al. "Three Dimensional CMOS Devices and Integrated Circuits", IEEE 2003, CICC, San Jose, CA, Sep. 21-24, 2003, pp. 207-214.
E.J. Nowak et al., "Scaling Beyond the 65nm Node with FinFET-DGCMOS", IEEE 2003, CICC, San Jose, CA, Sep. 21-24, 2003, pp. 339-342.
E.C. Jones, "Doping Challenges in Exploratory Devices for High Performance Logic", 14th International Conference, Piscataway, NJ, Sep. 22-27, 2002, pp. 1-6.
T. Park et al. "PMOS Body-Tied FinFET (Omega MOSFET) Characteristics", Device Research Conference, Piscataway, NJ, Jun. 23-25, 2003, IEEE, pp. 33-34.

E.J. Nowak et al., "A Functional FinFET-DGCMOS SRAM Cell", International Electron Devices Meeting 2002, San Francisco, CA, Dec. 8-11, 2002, pp. 411-414.
Jae-Hyoun Park, "Quantum-wired MOSFET Photodetector Fabricated by Conventional Photolithography on SOI Substrate", Nanotechnology, 2004, 4th IEEE Conference on Munich, Germany, Aug. 16-19, 2004, Piscataway, NJ, pp. 425-427, XP010767302.
L. Chang et al. "CMOS Circuit Performance Enhancement by Surface Orientation Optimization" IEEE Transactions on Electron Devices, IEEE Service Center, Piscataway, NJ vol. 51, No. 10, Oct. 2004, pp. 1621-1627 XP001211140.
M. Stadele et al., "A Comprehensive Study of Corner Effects in Tri-gate Transistors", IEEE 2004, pp. 165-168.
Ali Javey et al., "Ballistic Carbon Nanotube Field-Effect Transistors", Nature, vol. 424, Aug. 7, 2003, pp. 654-657.
U.S. Appl. No. 10/816,232, filed Mar. 31, 2004, Chang.
Buchanan, D. A., et al., "Fabrication of Midgap Metal Gates Compatible with Ultrathin Dielectrics," Applied Physics Letters, 73.12, (Sep. 21, 1998), pp. 1676-1678.
Chau, Robert et al., Advanced Depleted-Substrate Transistors: Single-gate, Double-gate and Tri-gate (Invited Paper), Components Research, Logic Technology Development, Intel Corporation, Hillsboro, OR, 2 pages, published date unknown, filed Jun. 20, 2011.
Claflin, B., et al., "Interface Studies of Tungsten Nitride and Titanium Nitride Composite Metal Gate Electrodes with Thin Dielectric Layers," Journal of Vacuum Science and Technology A 16.3, (May/Jun. 1998), pp. 1757-1761.
Collaert, N. et al. "A Functional 41-Stage ring oscillator using scaled FinFET devices with 25-nm gate lengths and 10-nm fin widths applicable for the 45-nm CMOS node" IEEE Electron Device Letters, vol. 254, No. 8 (Aug. 2004), 568-570.
Hwang, Jeong-Mo et al., "Novel Polysilicon/Tin Stacked-Gate Structure for Fully-Depleted SOI/CMOS," International Electronic Devices Meeting Technical Digest, (1992), pp. 345-348.
Lide, David R. "Properties of Semiconductors" CRC Handbook of Chemistry and Physics, internet version 2007, (87th edition), David R. Lide—editor; Taylor and Francis, 12-77-12-88.
Nackaerts et al., "A 0.314um2 6T-SRAM Cell build with Tall Triple-Gate Devices for 45nm node applications using 0.75NA 193nm lithography,", pp. 269-272, IEDM 2004.
Nowak, Edward J. et al., "Turning Silicon On Its Edge," IEEE Circuits & Devices Magazine, vol. 1, (Jan./Feb. 2004).
Park, Donggun et al., "3-Dimensional nano-CMOS Transistors to Overcome Scaling Limits," IEEE 2004, ISBN 0-7803-8511-X, (2004), 35-40.
Sugizaki, T. et al., "Novel Multi-bit SONOS Type Flash Memory Using a High-k Charge Trapping Layer," VLSITechnology, 2003, Digest of Technical Papers, Symposium on, Jun. 10-12, 2003, (2003), pp. 27-28.
Tang, Stephen H. et al., "FinFET—A quasi-planar double-gate MOSFET", 2001 IEEE International Solid-State Circuits Conference (Feb. 6, 2001), 1-3.
Tokoro, Kenji et al., "Anisotropic Etching Properties of Silicon in KOH and TMAH Solutions," International Symposium on Micromechatronics and Human Science, IEEE (1998), pp. 65-70.
Wolf, Stanley et al., "Wet Etching Silicon," Silicon Processing for the VLSI Era, vol. 1: Process Technology, Lattice Press, Sunset Beach, CA, (Sep. 1986), 3 pages.
Yang, Fu-Liang et al., "25 nm CMOS Omega FETs", pp. 255- 258 , IEEE IEDM 2002.
Breed, A., et al., "Dual-gate (FinFET) and tri-gate MOSFETs: simulation and design", Semiconductor Device Research Symposium, 2003 International, Dec. 10-12, 2003, pp. 150-151.
Wang, X. , et al., "Band alignments in sidewall strained Si/strained SiGe heterostructures", (May 28, 2002), Solid-State Electronics 46 (2002) 2021-2025.

* cited by examiner

<110> : <100> COMPARISON

Mobility along <100> and <110> directions. <110> is significantly lower than <100>

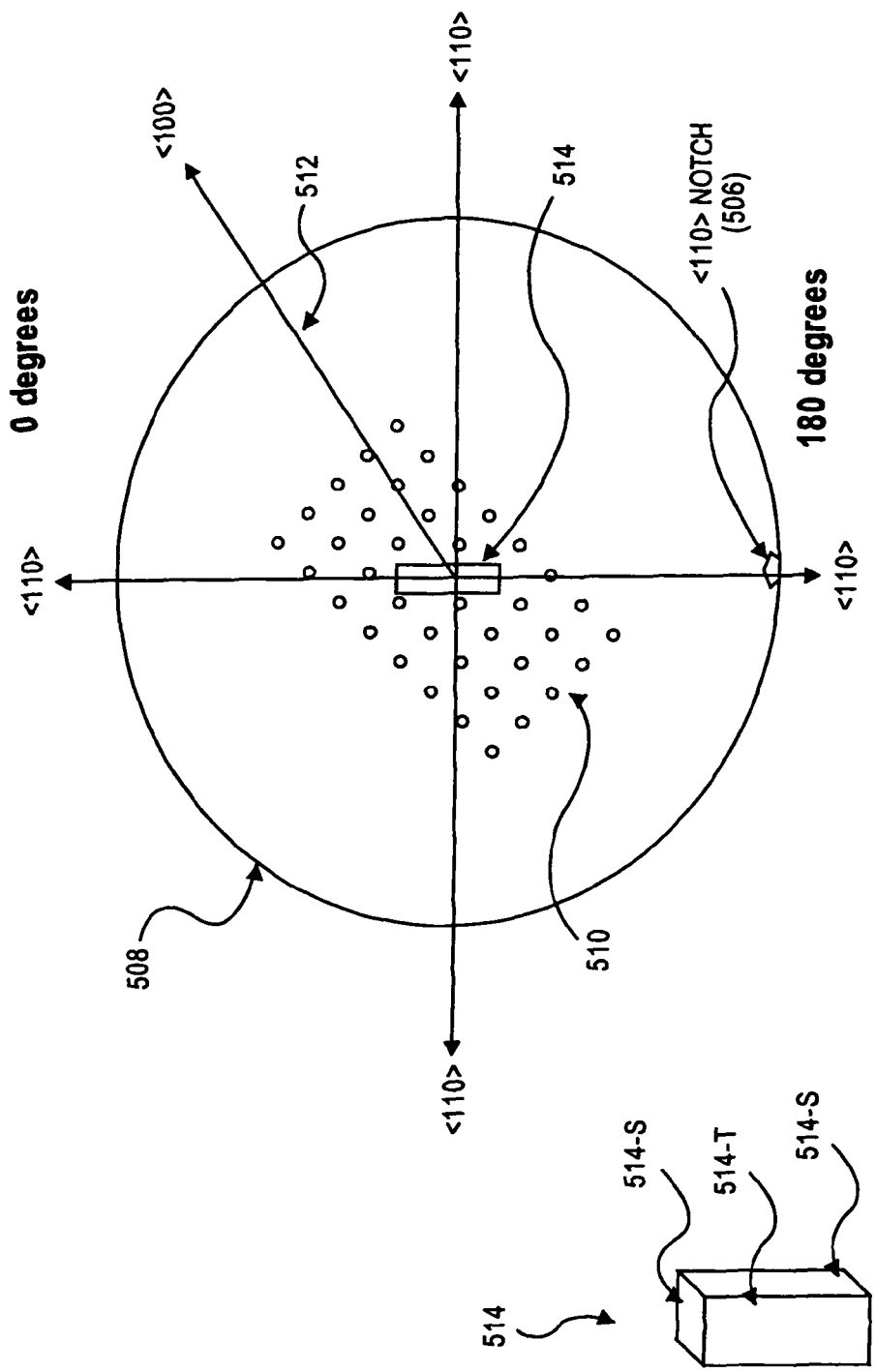

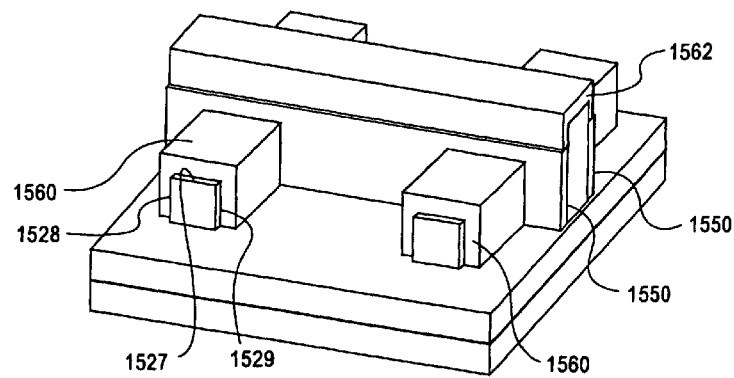
FIG. 15H
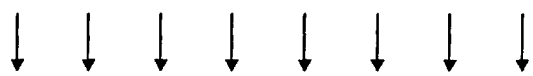
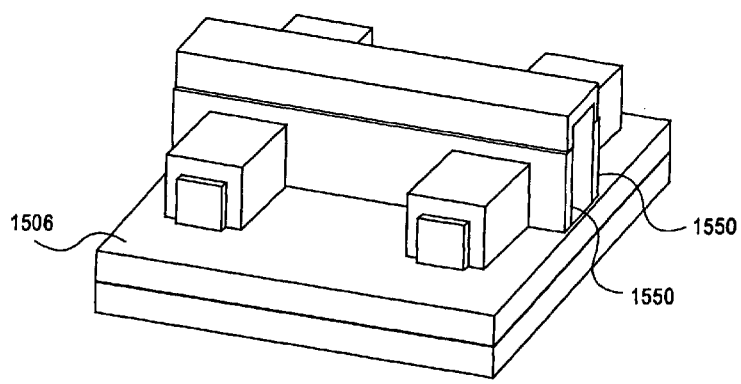
FIG. 15I

HIGH MOBILITY TRI-GATE DEVICES AND METHODS OF FABRICATION

RELATED APPLICATIONS

This is a divisional of U.S. patent application Ser. No. 10/883,183, now U.S. Pat. No. 7,042,009, filed on Jun. 30, 2004.

FIELD

The present invention relates to the field of semiconductor integrated circuit manufacturing, and more particularly to a high mobility tri-gate device such as a high mobility tri-gate transistor and their methods of fabrication.

DISCUSSION OF RELATED ART

In order to increase device performance, silicon on insulator (SOI) transistors have been proposed for the fabrication of modern integrated circuits. FIG. 1 illustrates a standard fully depleted silicon on insulator (SOI) transistor 100. The SOI transistor 100 includes a single crystalline silicon substrate 102 having an insulating layer 104, such as a buried oxide formed thereon. A single crystalline silicon body 106 is formed on the insulating layer 104. A gate dielectric layer 108 is formed on the single crystalline silicon body 106 and a gate electrode 110 is formed on the gate dielectric 108. Source 112 and drain 114 regions are formed in the silicon body 106 along laterally opposite sides of the gate electrode 110.

Fully depleted SOI have been proposed as a transistor structure to take advantage of ideal sub-threshold gradients for optimized on current/off current ratios. In order to achieve ideal subthreshold gradients with the transistor 100, the thickness (Tsi) of the silicon body 106 must be about ⅓ the size of the gate length (Lg) of the transistor or Tsi=Lg/3. However, as gate lengths scale, especially as they approach 30 nm, the need for ever decreasing silicon film thickness makes this approach increasingly impractical. At 30 nanometer gate length, the thickness required of the silicon body is thought to need to be less than 10 nanometers, and around 6 nanometer for a 20 nanometer gate length. The fabrication of thin silicon films with thicknesses of less than 10 nanometers, is considered to be extremely difficult. On one hand, obtaining wafer uniformity on the order of one nanometer is a difficult challenge. On the other hand, to be able to contact these thin films to form raised source/drain regions to decrease junction resistance, becomes almost impossible since the thin silicon layer in the source/drain regions becomes consumed during the gate etch and various cleans following the gate etch and spacer etch leaving insufficient silicon 106 for silicon to grow on.

A double gate (DG) device, such as shown in FIGS. 2A and 2B, have been proposed to alleviate the silicon thickness issue. The double gate (DG) device 200 includes a silicon body 202 formed on an insulating substrate 204. A gate dielectric 206 is formed on two sides of the silicon body 202 and a gate electrode 208 is formed adjacent to the gate dielectric 206 formed on the two sides of the silicon body 202. A sufficiently thick insulating layer 209, such as silicon nitride, electrically isolates the gate electrode 208 from the top of silicon body 202.

Double gate (DG) device 200 essentially has two gates, one on either side of the channel of the device. Because the double gate device 200 has a gate on each side of the channel, thickness (Tsi) of the silicon body can be double that of a single gate device and still obtain a fully depleted transistor operation. That is, with a double gate device 200 a fully depleted transistor can be formed where Tsi=(2×Lg)/3. The most manufacturable form of the double gate (DG) device 200, however, requires that the body 202 patterning be done with photolithography that is 0.7× smaller than that used to pattern the gate length (Lg) of the planar device (e.g., the transistor 100). In order to obtain high density integrated circuits, it is generally desirable to have the most aggressive lithography occur with respect to the gate length (Lg) of the gate electrode 208. Although, double gate structures double the thickness of the silicon film (since there now is a gate on either side of the channel) these structures, however, are hideously difficult to fabricate. For example, the silicon body 202 requires a silicon body etch which can produce a silicon body 202 with an aspect ratio (height to width) of about 5:1. Additionally, with demand for high device performance continue to increase, devices with high mobility to increase device performance are desirable.

BRIEF DESCRIPTION OF THE DRAWINGS

FIGS. 7A-7B illustrate a wafer sliced from the silicon ingot shown in FIG. 5 with a device formed thereon.

FIGS. 15A-15J illustrate an exemplary method of making a tri-gate transistor in accordance to an embodiment of the present invention.

DETAILED DESCRIPTION

Embodiments of the present invention pertain to a novel high mobility non-planar device or a tri-gate device such as a tri-gate transistor structure and methods of fabricating the same. In the following description numerous specific details are set forth in order to provide a thorough understanding in the embodiments of the present invention. In other instances, well-known semiconductor process and manufacturing techniques have not been described in particular detail in order to not unnecessarily obscure the embodiments of the present invention.

Figure 1:
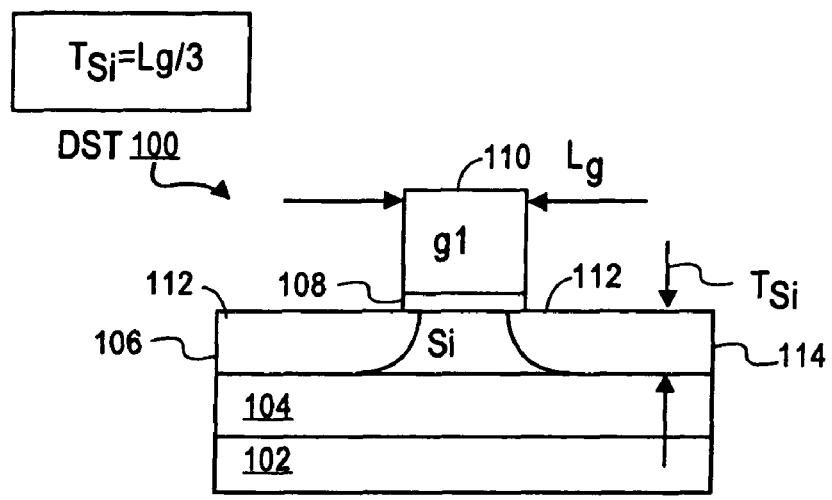
FIG. 1 is an illustration of a cross-sectional view of a depleted substrate transistor.
Figure 2A:
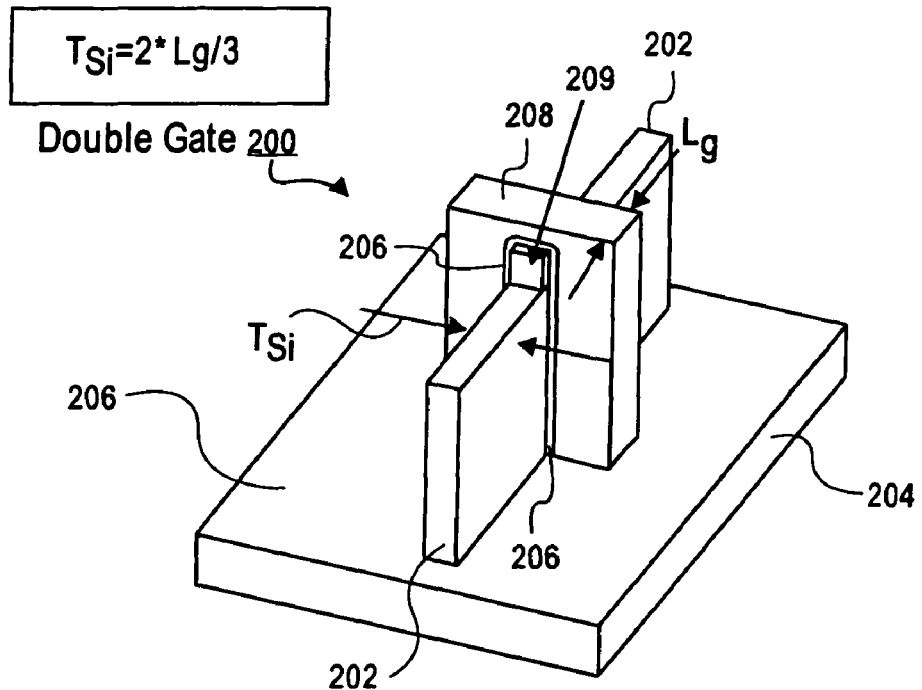
FIG. 2A and FIG. 2B illustrate a double gate depleted substrate transistor.
Figure 2B:
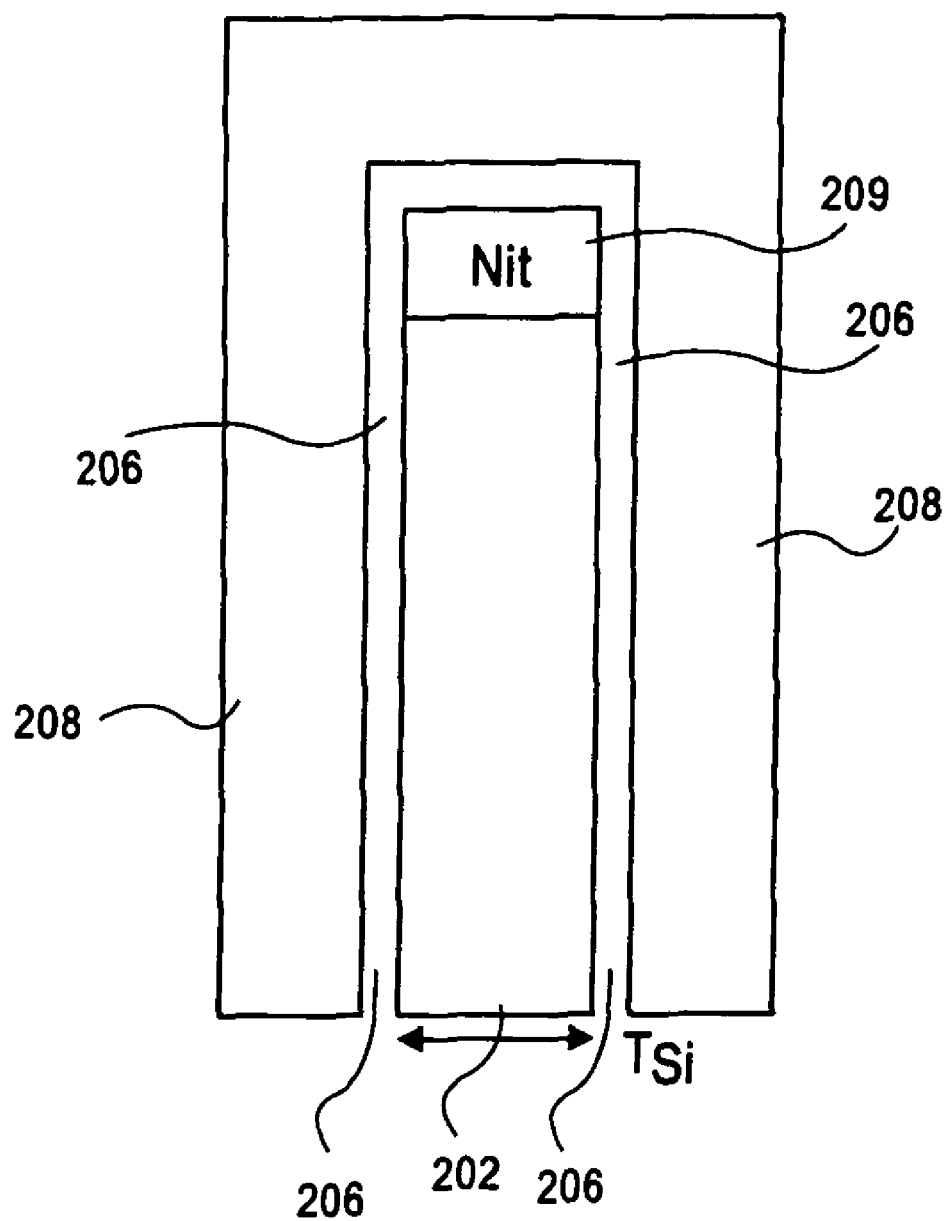
Figure 3:
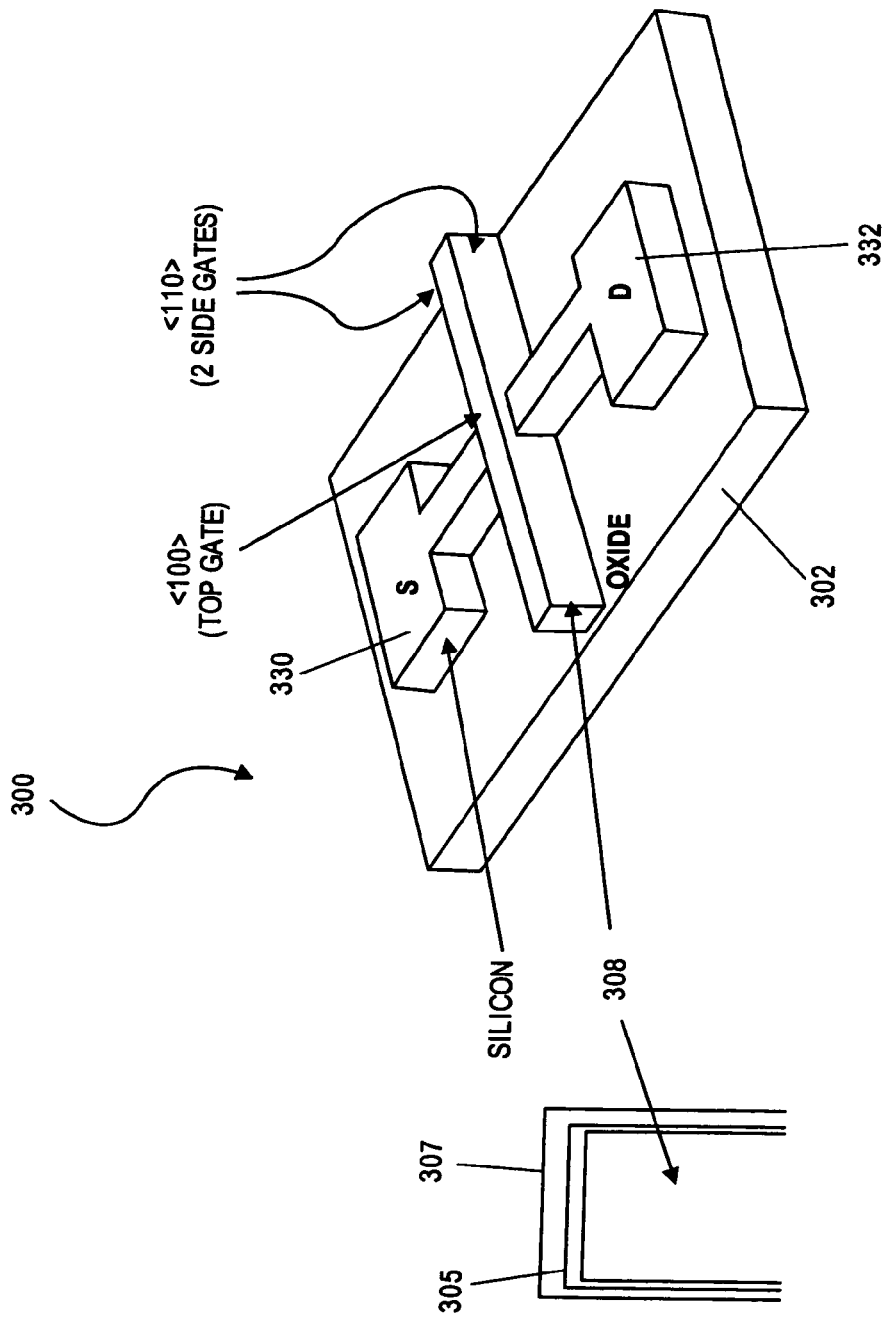
FIG. 3 is an illustration of a tri-gate transistor in accordance with an embodiment of the present invention.

Embodiments of the present invention pertain to a high mobility non-planar device (e.g., a tri-gate transistor). The high mobility characteristic of the non-planar device is achieved by rotation or relocation of a reference orientation of a substrate wafer that is used to form the high mobility non-planar device. FIG. 3 illustrates an exemplary non-planar device 300 (e.g., a tri-gate transistor).

In an embodiment of the present invention, the tri-gate transistor 300 is a semiconductor on insulator (SOI) transistor. The tri-gate transistor 300 includes a thin semiconductor body 308 formed on a substrate 302; the substrate 302 can be an insulating substrate (e.g., the substrate 302 including an oxide film) or a semiconductor substrate. The semiconductor body 308 includes a gate dielectric 305 which is formed on the top surface and the sidewalls of the semiconductor body 308, and a gate electrode 307 which is formed on the gate dielectric 305 on the top surface of the semiconductor body 308 and is formed adjacent to the gate dielectric 307 formed on the sidewalls of the semiconductor body 308. Source and drain regions 330 and 332, respectively, are formed in the semiconductor body 308 on opposite sides of the gate electrode 307. Because the gate electrode 307 and the gate dielectric 305 surround the semiconductor body 308 on three sides, the transistor 300 essentially has three separate channels and gates. The gate "width" of a transistor is equal to the sum of each of the three sides of the semiconductor body.

Because there are three separate channels formed in the semiconductor body, the semiconductor body can be fully depleted when the transistor is turned "ON", thereby enabling the formation of a fully depleted transistor with gate lengths of less than 30 nanometers without requiring the use of ultra-thin semiconductor bodies or requiring photolithographic patterning of the semiconductor bodies to dimensions less than the gate length (Lg) of the device. Because the tri-gate transistor of the present invention can be operated in a fully depleted manner, the device is characterized by ideal (e.g., very sharp) subthreshold slope and a reduced drain induced barrier lowering (DIBL) short channel effect of less than 100 mV/V and ideally about 60 mV/V which results in a lower leakage current when the device is turned "OFF" resulting in lower power consumption.

Figure 4:
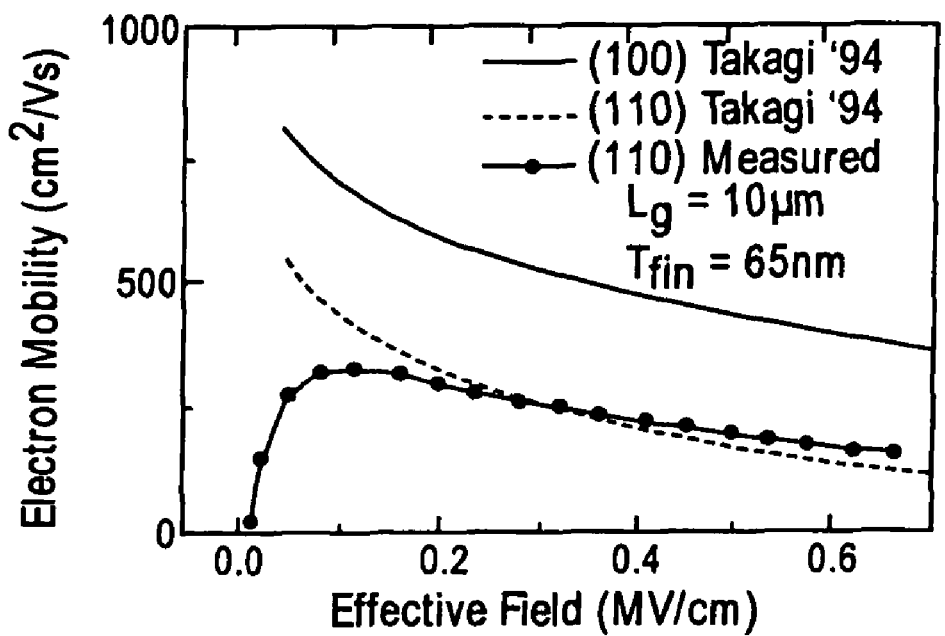
FIG. 4 is an illustrative comparison of <100> and <110> mobility characteristics.

It is desirable to have non-planar devices such as the tri-gate transistor 300 being high mobility devices for improved device performance. In the embodiments of the present invention, in order to improve the mobility of the non-planar device 300, the crystal plane structure of the semiconductor body 308 is altered. As shown in FIG. 3, the non-planar device 300 has a vertical field on the top surface of the semiconductor body 308 that has a <100> crystal plane. The vertical field for the sides of semiconductor body 308 has a <110> crystal plane. It has been shown that there is a significant difference between the <100> and the <110> crystal planes in term of mobility. The <110> crystal plane has a mobility value that is about half of the <100> crystal plane as shown in FIG. 4. As shown in FIG. 4, the Takagi line for the <100> crystal plane is significantly higher than the Takagi line for the <110> crystal plane. One way to improve the mobility of the non-planar device is to have the vertical fields for all sides of the semiconductor body 308 have the <100> crystal plane.

Most often, the substrate 302 is made of a semiconductor wafer, which is then processed where films and structures are formed therein to form semiconductor devices such as the tri-gate device 300. In one instance, the substrate 302 is a bulk silicon wafer. An insulation layer (e.g., a silicon dioxide film) is formed over the substrate 302, and a device quality semiconductor film (e.g., a monocrystalline silicon) is formed over the insulation layer. The device 300 is then formed in the device quality semiconductor film. It is a practice in the semiconductor fabrication field to create a reference orientation on a wafer or wafers that are used to form devices. The reference orientation is typically a small notch created in the wafer. The reference orientation is useful for equipments (e.g., etching tool or lithography tool) alignment purpose and especially for fabrication repeatability (e.g., device processes such as lithography and etching). The processing tools thus have an alignment point where each notch on a particular wafer is aligned for processing. As is known, silicon or other semiconductor material has different crystal cubic orientation at different planes of the wafer. Thus, for repeatability of the crystal orientation, the reference orientation is created to mark a uniform direction for the wafer. The reference orientation also provides repeatability of processes from wafer to wafer.

Figure 5:
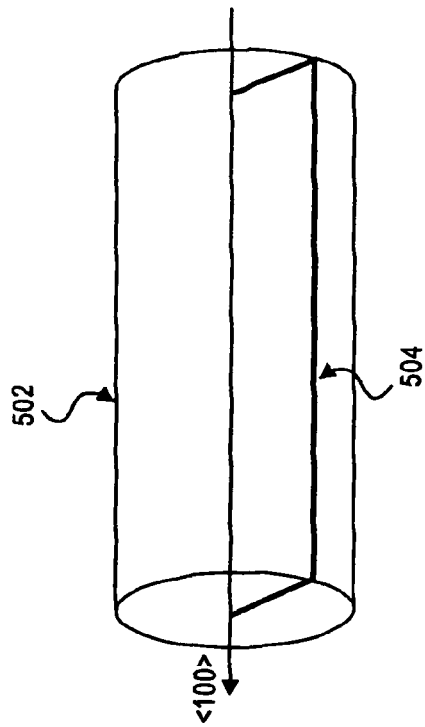
FIG. 5 is an illustration of a silicon ingot grown in a <100> crystal plane direction and having a reference orientation at a <110> crystal plane location.
Figure 6:
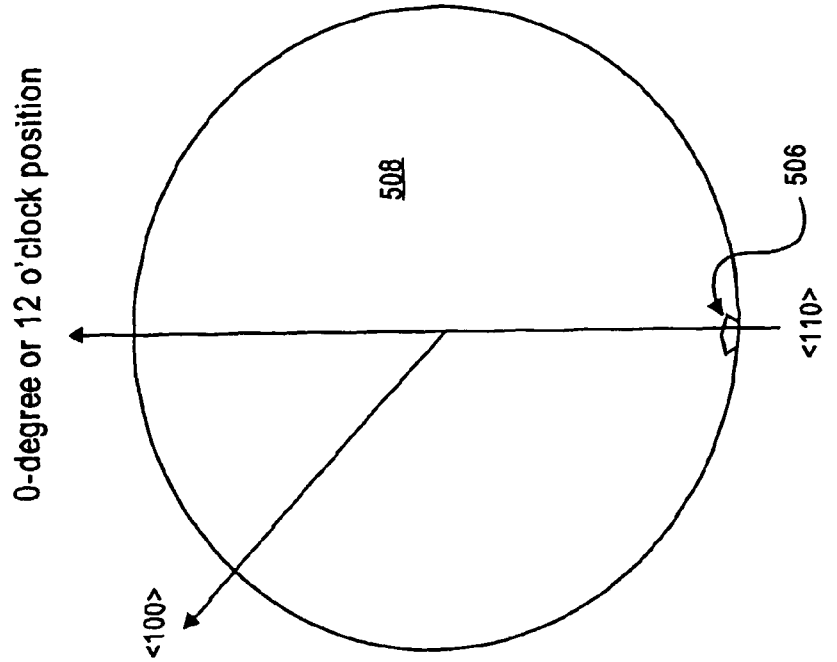
FIG. 6 is an illustration of a wafer sliced from the silicon ingot shown in FIG. 5.

One way to create the reference orientation in a wafer is to make a notch at a particular position on the wafer. Currently, an ingot, e.g., a silicon ingot, is grown with seed in the direction of the <100> crystal plane. As illustrated in FIG. 5, the ingot 502 is grown in the <100> crystal plane direction. The ingot 502 is the placed in an X-Ray-Diffraction tool to allow one to find the <110> plane direction. During the X-Ray-Diffraction process, the ingot 502 is rotated radially so that the X-Ray-Diffraction beam can visualize and locate the <110> location. Once the <110> location is found, the ingot 502 is marked along the line 504 so that the notch 506 can be formed in each wafer as shown in FIG. 6. Grinding may be used to create the line 504. Slicing is then used to slice the ingot 502 to create a plurality of wafer 508. As illustrated in FIG. 6, the wafer 508 has a <100> crystal plane in the direction point out of the page. The notch 506 has a <110> crystal plane and is located at the 180-degree or 6 o'clock position of the wafer 508.

FIG. 7A illustrates further the crystal structure properties of the wafer 508. Circles 510 represent the crystal plane of the crystal structure of the wafer 508 with respect to the plane of the page. As illustrated, the <100> crystal plane is the surface of the wafer 508 and as such in the direction of the arrow 512 pointing out of the page. When a non-planar device 514 is formed in the wafer 508, the sides 514-S of the non-planar device 514 will have the <110> crystal planes as illustrated in FIG. 7A. The top side 514-T of the device 514 has the <100> crystal plane. One way to alter the crystal plane structures of the sides of the device 514 formed in the wafer 508 is to rotate or relocate the notch 506. In one embodiment of the present invention, instead of having the notch 506 located at the <110> crystal plane location as conventionally done, the notch 506 is located at a <100> crystal plane location on the wafer 508. In another embodiment, the notch 506 can be marked at the <110> location as conventionally done and the wafer 508 is rotated about 45 degrees (or −45 degrees) in the fabrication tool so that the crystal planes as illustrated by the circles 510 are rotated by about 45 degrees (or −45 degrees).

Figure 8A:
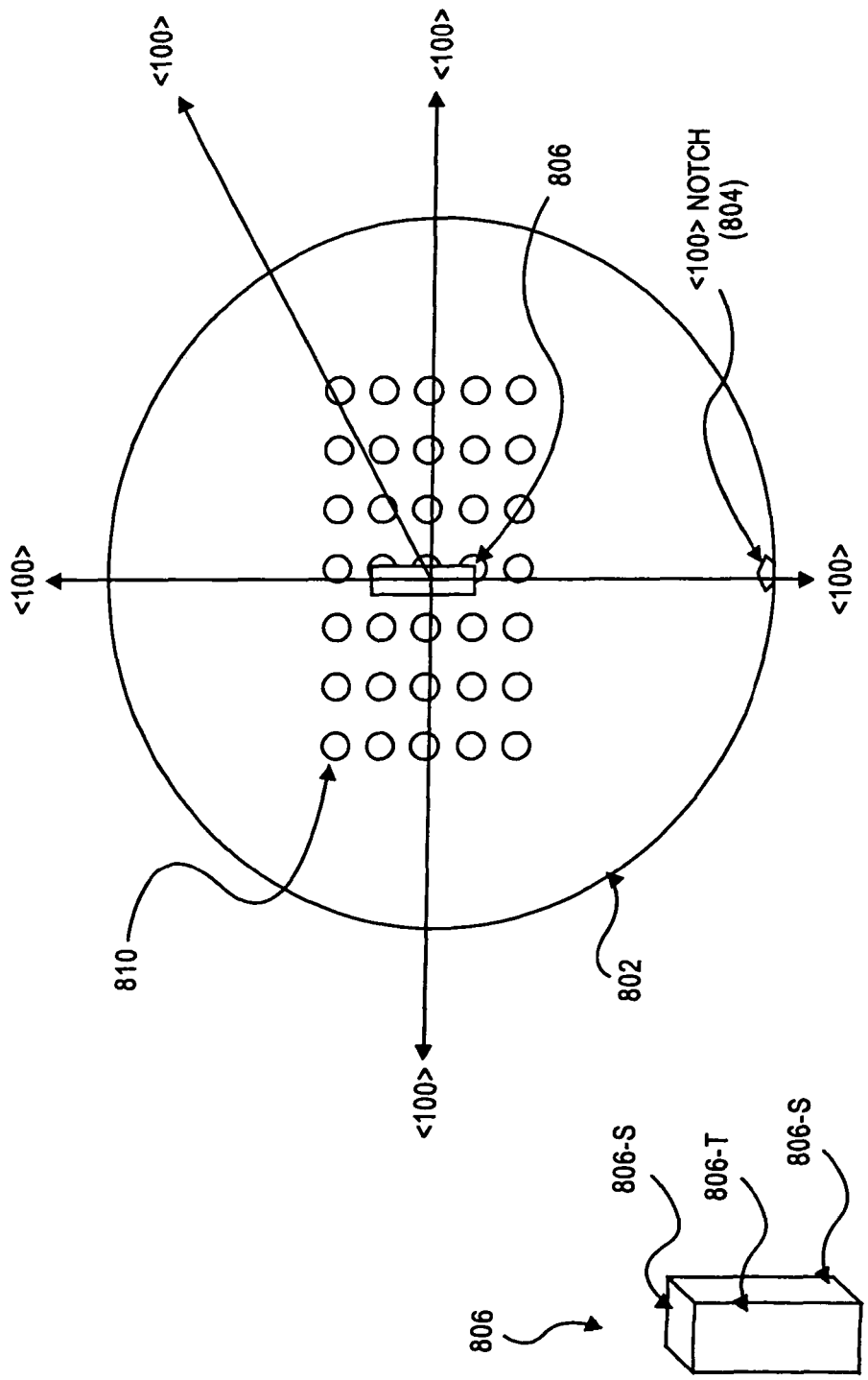
FIGS. 8A-8B illustrate a wafer with a reference notch formed at a <100> crystal plane location.
Figure 8B:
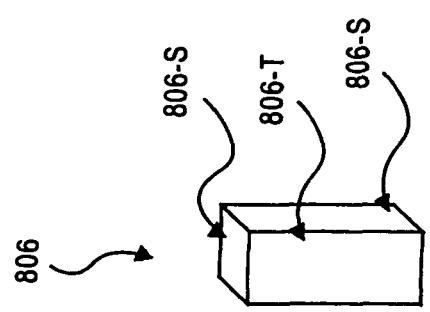

FIG. 8A illustrates a wafer 802 having a notch 804 at a <100> crystal plane location. The circles 810 shown in the wafer 802 indicate the crystal plane of the crystal structure of the wafer 802 with respect to the plane of the page. Pointing out of the page, the crystal plane of the wafer 802 is <100>. When a non-planar device 806 is formed in the wafer 802, all sides of the devices 806 have a <100> crystal plane. Thus, the top surface 806-T of the device 806 has a <100> crystal plane and all sides 806-S of the devices 806 also have a <100> crystal plane.

Alternatively, when the wafer has the notch at the <110> location, during processing, the wafer can be rotated by 45 degrees (or −45 degrees). In doing so, when a non-planar device is formed on the wafer, all sides of the devices also have a <100> crystal plane.

With all sides of the non-planar device having the <100> crystal planes, the non-planar device will have the high mobility characteristic that is desirable for high performance devices.

Figure 9:
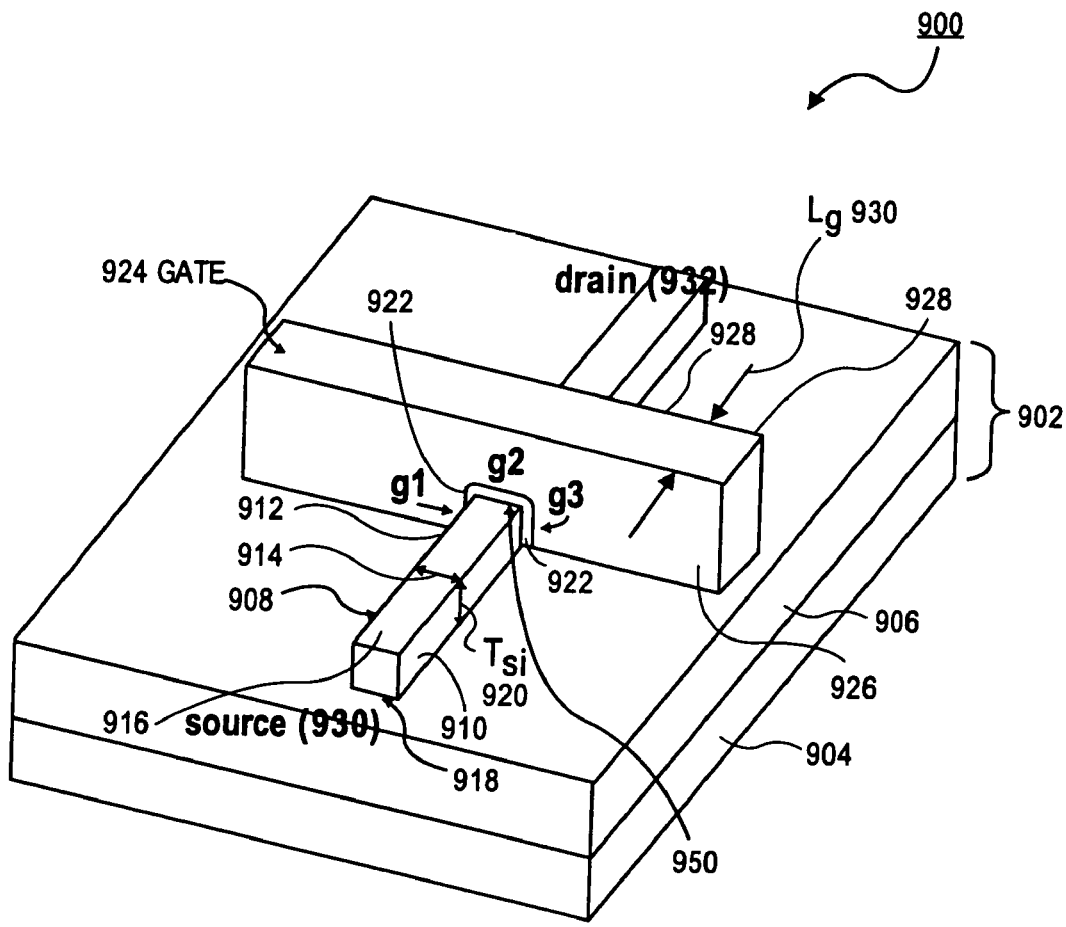
FIG. 9 is an illustration of a tri-gate transistor in accordance with an embodiment of the present invention.

FIG. 9 illustrates an exemplary non-planar device such as a tri-gate device (e.g., a tri-gate transistor 900) that can benefit from the high mobility characteristic of the device by having the notch of the wafer relocated or rotated. The non-planar device is thus a high mobility non-planar device, which can be a high mobility tri-gate transistor.

The tri-gate transistor 900 is formed on a substrate 902. In an embodiment of the present invention, the substrate 902 is an insulating substrate which includes a lower monocrystalline silicon substrate 904 upon which is formed an insulating layer 906, such as a silicon dioxide film. The tri-gate transistor 900, however, can be formed on any well-known insulating substrate such as substrates formed from silicon dioxide, nitrides, oxides, and sapphires. In an embodiment of the present invention, the substrate 902 can be a semiconductor substrate, such as but not limited to monocrystalline silicon substrate and gallium arsenide substrate.

The tri-gate transistor 900 includes a semiconductor body 908 formed on the insulating layer 906 of the insulating substrate 902. The semiconductor body 908 can be formed from a semiconductor film. With the semiconductor film on the insulating substrate 902, the tri-gate transistor 900 can be thought of as an SOI transistor. The semiconductor body 908 can be formed of any well-known semiconductor material, such as but not limited to silicon (Si), germanium (Ge), silicon germanium ($Si_xGe_y$), gallium arsenide (GaAs), InSb, GaP, GaSb and carbon nanotubes. The semiconductor body 908 is ideally a single crystalline film when the best electrical performance of the transistor 900 is desired such as in microprocessors. The semiconductor body 908, however, can be a polycrystalline film when the transistor 900 is used in applications requiring less stringent performance, such as in liquid crystal displays. The wafer used to form the semiconductor body 908 is processed so that all sides of the semiconductor body 908 will have a <100> crystal planes as previously described.

In one embodiment, the semiconductor material used to form the semiconductor body 908 is a wafer (e.g., a silicon wafer) processed or formed with a reference notch located at a <100> crystal plane location on the wafer. In another embodiment, the semiconductor material used to form the semiconductor body 808 is a wafer (e.g., a silicon wafer) processed or formed with a reference notch located at a <110> crystal plane location on the wafer. In this another embodiment, the wafer used to form the semiconductor body 908 is rotated so that the reference notch is offset by about 45 degrees or by −45 degrees.

The semiconductor body 908 has a pair of laterally opposite sidewalls 910 and 912 separated by a distance, which defines a semiconductor body width 914. Additionally, the semiconductor body 908 has a top surface 916 opposite a bottom surface 918 formed on the substrate 902. The distance between the top surface 916 and the bottom surface 918 defines a body height 920 or the thickness Tsi of the semiconductor body 908. In an embodiment of the present invention the body height 920 is substantially equal to the body width 914. In an embodiment of the present invention, the body 908 has a width 914 and height 920 less than 30 nanometers and ideally less than 20 nanometers. In an embodiment of the present invention, the body height 920 is between ½ the body width 914 to 2 times the body width 914. The sidewalls 910 and 912, the top surface 916, and the bottom surface 918 all have a vertical field having the <100> crystal plane structure.

The tri-gate transistor 900 has a gate dielectric layer 922. The gate dielectric layer 922 is formed on and around three sides of the semiconductor body 908 as shown in FIG. 9. The gate dielectric layer 922 is formed on or adjacent to the sidewall 912, on the top surface 916, and on or adjacent to the sidewall 910 of the body 908 as shown in FIG. 9. The gate dielectric layer 922 can be any well-known gate dielectric layer. In an embodiment of the present invention, the gate dielectric layer is a silicon dioxide ($SiO_2$), silicon oxynitride ($SiO_xN_y$) or a silicon nitride ($Si_3N_4$) dielectric layer. In an embodiment of the present invention, the gate dielectric layer 922 is a silicon oxynitride film formed to a thickness of between 5-20 Å. In an embodiment of the present invention, the gate dielectric layer 922 is a high K gate dielectric layer, such as a metal oxide dielectric, such as but not limited to tantalum pentaoxide ($Ta_2O_5$), and titanium oxide ($TiO_2$). The gate dielectric layer 922 can be other types of high K dielectric, such as but not limited to PZT (lead zirconate titanate).

The tri-gate device 900 has a gate electrode 924. The gate electrode 924 is formed on and around the gate dielectric layer 922 as shown in FIG. 9. The gate electrode 924 is formed on or adjacent to the gate dielectric 922 formed on the sidewall 912 of the semiconductor body 908, is formed on the gate dielectric 922 formed on the top the surface 916 of the semiconductor body 908, and is formed adjacent to or on the gate dielectric layer 922 formed on the sidewall 910 of the semiconductor body 908. The gate electrode 924 has a pair of laterally opposite sidewalls 926 and 928 separated by a distance which defines the gate length (Lg) 930 of the transistor 900. In an embodiment of the present invention the laterally opposite sidewalls 926 and 928 of the gate electrode 924 run in a direction perpendicular to the laterally opposite sidewalls 910 and 912 of the semiconductor body 908.

The gate electrode 924 can be formed of any suitable gate electrode material. In an embodiment of the present invention the gate electrode 924 comprises of polycrystalline silicon doped to a concentration density between $1\times10^{19}$ atoms/$cm^3$-$1\times10^{20}$ atoms/$cm^3$. In an embodiment of the present invention the gate electrode can be a metal gate electrode, such as but not limited to, tungsten, tantalum, titanium, and their nitrides. In an embodiment of the present invention the gate electrode is formed from a material having a mid-gap work function between 4.6-4.8 eV. It is to be appreciated, the gate electrode 924 need not necessarily be a single material and can be a composite stack of thin films, such as but not limited to a polycrystalline silicon/metal electrode or a metal/polycrystalline silicon electrode.

The tri-gate transistor 900 has a source region 930 and a drain region 932. The source region 930 and drain region 932 are formed in semiconductor body 908 on opposite sides of gate electrode 924 as shown in FIG. 9. The source region 930 and the drain region 932 are formed of the same conductivity type such as N-type or P-type conductivity. In an embodiment of the present invention the source region 930 and the drain region 932 have a doping concentration of between $1\times10^{19}$, and $1\times10^{21}$ atoms/$cm^3$. The source region 930 and the drain region 932 can be formed of uniform concentration or can include sub-regions of different concentrations or doping profiles such as tip regions (e.g., source/drain extensions). In an embodiment of the present invention when the transistor 900 is a symmetrical transistor, the source region 930 and the drain region 932 will have the same doping concentration and profile. In an embodiment of the present invention when the tri-gate transistor 900 is formed as an asymmetric transistor then the doping concentration and profile of the source region 930 and the drain region 932 may vary in order to obtain a particular electrical characteristic.

The portion of semiconductor body 908 located between the source region 930 and the drain region 932, defines the channel region 950 of the transistor 900. The channel region 950 can also be defined as the area of the semiconductor body 908 surrounded by the gate electrode 924. At times however, the source/drain region may extend slightly beneath the gate electrode through, for example, diffusion to define a channel region slightly smaller than the gate electrode length (Lg). In an embodiment of the present invention, the channel region 950 is intrinsic or undoped monocrystalline silicon. In an embodiment of the present invention, the channel region 950 is doped monocrystalline silicon. When channel region 950 is doped, it is typically doped to a conductivity level of between $1\times10^{16}$ to $1\times10^{19}$ atoms/cm$^3$. In an embodiment of the present invention, when the channel region 950 is doped it is typically doped to the opposite conductivity type of the source region 930 and the drain region 932. For example, when the source and drain regions are N-type conductivity the channel region 950 would be doped to p type conductivity. Similarly, when the source and drain regions are P type conductivity the channel region 950 would be N-type conductivity. In this manner the tri-gate transistor 900 can be formed into either a NMOS transistor or a PMOS transistor respectively. The channel region 950 can be uniformly doped or can be doped non-uniformly or with differing concentrations to provide particular electrical and performance characteristics. For example, the channel regions 950 can include well-known "halo" regions, if desired.

By providing a gate dielectric and a gate electrode which surrounds the semiconductor body 908 on three sides, the tri-gate transistor 900 is characterized in having three channels and three gates, one (g1) which extends between the source and drain regions on side 912 of silicon body 908, a second (g2) which extends between the source and drain regions on the top surface 916 of silicon body 908, and the third (g3) which extends between the source and drain regions on the sidewall 910 of silicon body 908. Each of the gate g1, g2, and g3 has a <100> crystal plane structure due to the construction of the semiconductor body 908 as previously discussed. The mobility is thus improved with three <100> crystal plane gates making the transistor 900 a high mobility non-planar device. The gate "width" (Gw) of transistor 900 is the sum of the widths of the three channel regions. Thus, the gate width of the transistor 900 is equal to the height 920 of the silicon body 908 at the sidewall 910, plus the width of the silicon body of 908 at the top surface 916, plus the height 920 of the silicon body 908 at the sidewall 912. Larger "width" transistors can be obtained by using multiple devices coupled together (e.g., multiple silicon bodies 908 surrounded by a single gate electrode 924).

Because the channel region 950 is surrounded on three sides by the gate electrode 924 and the gate dielectric 922, the transistor 900 can be operated in a fully depleted manner. When the transistor 900 is turned "on," the channel region 950 fully depletes thereby providing the advantageous electrical characteristics and performance of a fully depleted transistor. Additionally, when the transistor 900 is turned "ON" a depletion region is formed and a channel region 950 along with an inversion layer at the surfaces of the channel region 950 (e.g., an inversion layer is formed on the side surfaces and the top surface of the semiconductor body 908). The inversion layer has the same conductivity type as the source and drain regions and forms a conductive channels between the source and drain regions to allow current to flow there between. The tri-gate transistor 900 is a nonplanar transistor because the channel regions are formed in both the horizontal and vertical directions in the semiconductor body 908. The depletion region depletes free carriers from beneath the inversion layers. The depletion region extends to the bottom of the channel region 950, thus the transistor can be said to be a "fully depleted" transistor. Fully depleted transistors have improved electrical performance characteristics over non-fully depleted or partially depleted transistors. For example, by operating the transistor 900 in the fully depleted manner, the transistor 900 has an ideal or very steep subthreshold slope. The tri-gate transistor can be fabricated with very steep sub-threshold slope of less than 80 mV/decade, and ideally about 60 mV/decade even when fabricated with semiconductor body thicknesses of less than 30 nm. Additionally, with the transistor 900 being fully depleted, the transistor 900 has an improved drain induced barrier (DIBL) low in effect which provides for better "OFF" state leakage which results in lower leakage and thereby lower power consumption. In an embodiment of the present invention the tri-gate transistor 900 has a DIBL effect of less than 100 mV/V and ideally less than 40 mV/V.

Because the transistor 900 has gates with high mobility characteristic due to the <100> crystal plane, the electrical characteristic of the transistor 900 is even better than devices with only the top surface having the <100> crystal planes.

Figure 10:
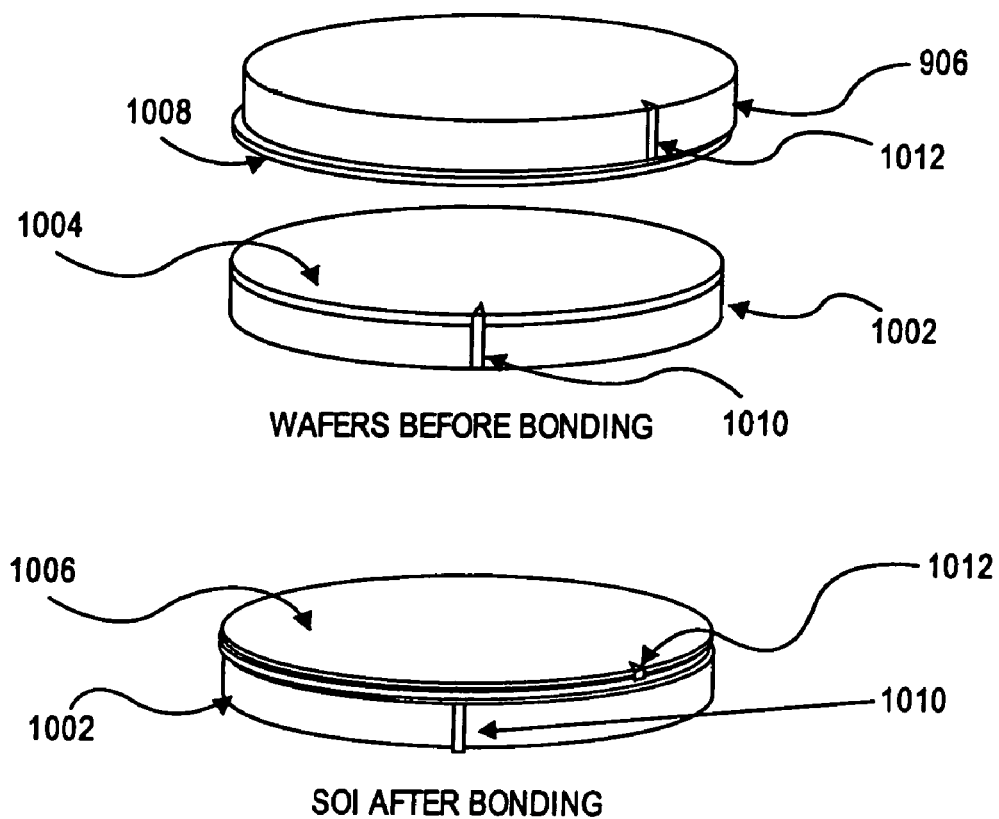
FIG. 10 is an illustration of a method of forming a high mobility silicon substrate for a tri-gate device in accordance to an embodiment of the present invention.

FIG. 10 illustrates an exemplary method of fabricating a substrate for a non-planar device such as the tri-gate transistor 900 in accordance with embodiments of the present invention. In one embodiment, a substrate 1002 is the first provided. The substrate 1002 can be a semiconductor substrate such as but not limited to a bulk silicon substrate, a monocrystalline silicon substrate, a lower monocrystalline silicon substrate, a polysilicon substrate, or a gallium arsernide substrate or other suitable semiconductor material. In one embodiment, the substrate 1002 includes an insulating layer 1004 such as a silicon dioxide film, a silicon nitride film, or other suitable dielectric films. The insulating layer 1004 may have a thickness between about 200-2000 angstroms.

A semiconductor device substrate 1006 is bonded to the substrate 1002. In the embodiment where the substrate 1002 includes the insulating layer 1004, the device substrate 1006 is bonded to the substrate 1002 at the insulating layer 1004. The semiconductor device substrate 1006 is the substrate with which a semiconductor body or bodies of the tri-gate transistor are fabricated. In one embodiment, the semiconductor device substrate 1006 is of a high quality silicon. In other embodiments, the semiconductor device substrate 1006 can be other types of semiconductor films such as but not limited to germanium (Ge), silicon germanium alloy (SiGe), gallium arsenide (GaAs), indium antimony (InSb), gallium phosphide (GaP), gallium antimony (GaSb), as well as carbon nanotubes.

In an embodiment of the present invention, the semiconductor device substrate 1006 is an intrinsic (undoped) silicon film. In other embodiments, the semiconductor device substrate 1006 is doped to a p type or n type conductivity with a concentration level between $1\times10^{16}$-$1\times10^{19}$ atoms/cm$^3$. The semiconductor device substrate 1006 can be insitu doped (e.g., doped while it is deposited) or doped after it is formed on the substrate 1002 by for example ion-implantation. Doping after formation enables both PMOS and NMOS tri-gate devices to be fabricated can be easily done on the same insulating substrate. The doping level of the semiconductor body at this point determines the doping level of the channel region of the non-planar device. In one embodiment, the semiconductor device substrate 1006 includes an insulating layer 1008 which can be a silicon dioxide film or a silicon nitride film, or other suitable dielectric film. The insulating layer 1008 may have a thickness between about 200 angstrom to about 2000 angstroms.

The semiconductor device substrate 1006 has a thickness which is approximately equal to the height desired for the subsequently formed semiconductor body or bodies of the fabricated tri-gate transistor. In an embodiment of the present invention, the semiconductor device substrate 1006 has a thickness or height 1016 of less than 30 nanometers and ideally less than 20 nanometers. In an embodiment of the present invention, the semiconductor device substrate 1006 has a thickness 1016 approximately equal to the gate "length" desired of the fabricated tri-gate transistor. In an embodiment of the present invention, the semiconductor device substrate 1006 has a thickness 1016 that is thicker than the desired gate length of the tri-gate transistor to be formed. In an embodiment of the present invention, the semiconductor device substrate 1006 has a thickness 1016 that will enable the fabricated tri-gate transistor to be operated in a fully depleted manner for its designed gate length (Lg). After the device substrate 1006 is bonded to or formed on the substrate 1002, an SOI substrate is formed. The semiconductor body for a tri-gate device is formed in the device substrate 1006. The device substrate 1006 is bonded to the substrate 1002 such that the tri-gate device formed in the device substrate 1006 will have <100> crystal plane in all sides.

The semiconductor device substrate 1006 can be formed on (or bonded to) the insulating substrate 1002 using any well-known method. In one exemplary method, the substrate 1002 includes a notch 1010 located at a <110> crystal plane location. The substrate 1002 can be a wafer sliced from an ingot that has a reference notch created at the <110> location as previously described. In one embodiment, the device substrate 1006 includes a notch 1012, also located at a <110> crystal plane location. Similar to the substrate 1002, the device substrate 1006 can be a wafer sliced from an ingot that has a reference notch created at the <110> crystal plane location. The device substrate 1006 may be of a higher quality than the substrate 1006. In one embodiment, the substrate 1002 includes an insulating layer 1004 and the device substrate 1006 includes an insulating layer 1008. The device substrate 1006 and the substrate 1002 are bonded together at the insulating layers using methods such as SMARTCUT or Bonded and Etch Back SOI (BESOI), or other bonding method. Before being bonded together, the device substrate 1006 is rotated so that the notch 1012 is offset by 45 degrees or −45 degrees with respect to the notch 1010. The crystal plane structure of the device substrate 1006 is thus altered.

In the SMARTCUT method, (FIG. 11), the device substrate 1006 may be oxidized to create the insulating layer 1008. The substrate 1002 may also be oxidized to create the insulating layer 1004. Ion implantation is then used implant ions to a predetermined depth in the device substrate 106 to induce formation of an in-depth weakened layer in the device substrate 1006. The substrates 1002 and 1006 are then cleaned and bonded to each other at the insulating layers 1004 and 1008. Prior to bonding, the substrate 1002 and the device substrate 1006 are offset with each other by about 45-degrees (or −45 degrees). In one embodiment, the substrates 1002 and 1006 are aligned over each other so that the notch 1012 of the substrate 1006 and the notch 1010 of the substrate 1002 are offset by 45 degrees to each other. In more particular, the substrate 1006, when bonded to the substrate 1002 has the notch 1012 rotated 45 degrees or −45 degrees with respect to the notch 1010 of the substrate 1002 (see FIG. 10). The offset of the notches 1012 to the notch 1010 will provide the tri-gate with a <100> crystal planes in all sides of the gate as previously discussed. Cleavage is then used to cleave a portion of the device substrate 1006 at the depth of the ion implantation. The remaining portion of the device substrate 1006 including the insulating layer 1008 is transferred (via bonding) to the substrate 1002. Annealing and polishing (e.g., chemical mechanical polishing (CMP)) may be used to complete the formation of an SOI substrate. The substrate 1002 and the device substrate 1006 having the oxides layers 1004 and 1008 sandwiched there between is referred to as the SOI substrate. The tri-gate device having <100> crystal plane structure on all sides will be formed on the device substrate 1006 surface.

In the BESOI method, (FIG. 12), the device substrate 1006 may be oxidized to create the insulating layer 1008. The substrate 1002 may also be oxidized to create the insulating layer 1004. The substrates 1002 and 1006 are cleaned and bonded to each other at the insulating layers 1004 and 1008. Prior to bonding, the substrate 1002 and the device substrate 1006 are offset with each other by about 45 degrees (or −45 degrees). In one embodiment, the substrates 1002 and 1006 are aligned over each other so that the notch 1012 of the substrate 1006 and the notch 1010 of the substrate 1002 are offset by 45 degrees to each other. In more particular, the substrate 1006, when bonded to the substrate 1002 has the notch 1012 rotated 45 degrees or −45 degrees with respect to the notch 1010 of the substrate 1002 (see FIG. 10). The offset of the notches 1012 to the notch 1010 will provide the tri-gate with a <100> crystal planes in all sides of the gate as previously discussed. After the bonding, the substrate 1006 is etched and polished (FIG. 11) to obtain the desired thickness. Annealing and polishing (e.g., CMP) may be used to complete the formation of the SOI substrate. The tri-gate device having <100> crystal plane structure on all sides will be formed on the device substrate 1006 surface.

In one embodiment, a Separation by Implantation of Oxygen (SIMOX) method is used to form the SOI substrate. In this embodiment, (FIG. 13) a substrate 1300 is provided and deep implantation of oxygen ions (typically high dose) is performed into the substrate 1300 to form the SOI substrate. The substrate 1300 is annealed to complete the formation of the SOI substrate. A buried oxide layer 1302 will be formed within the substrate 1300. In one embodiment, the substrate 1300 is a single crystalline silicon substrate. The tri-gate device will be formed above the silicon portion that is above the buried oxide layer 1302. Thus, the silicon portion that is above the oxide layer 1302 is essentially the device substrate 1006. In one embodiment, the substrate 1300 is formed from an ingot having a reference line created at the <110> crystal plane location such that when spliced from the ingot, the substrate 1300 has a reference notch created at a <110> crystal plane location. When placed on a processing tool, the notch is offset by 45 degrees or −45 degrees with respect to an alignment point on the processing tool. Thus, instead of processing the substrate 1300 where the notch is aligned as conventionally would (e.g., aligned to a designated location on the processing tool designated for the notch), the substrate 1300 is rotated so that the notch is offset during processing. Offsetting the notch will provide the tri-gate with a <100> crystal planes in all sides of the gate as previously discussed. In alternative embodiments, the substrate 1300 can be created from an ingot 1400 (FIG. 14A) wherein a reference line is located at a <100> crystal plane location. When the ingot 1400 is spliced into wafers to create the substrate 1300, a notch 1404 will be created at a <100> crystal plane location. The substrate 1300 with the <100> notch can be processed using the SIMOX method previously discussed. A tri-gate device can be formed in the substrate 1300 without the need to rotate the substrate 1300 by 45 degrees or –45 degrees to create the tri-gate with all sides having the <100> crystal plane structure.

Figure 13:
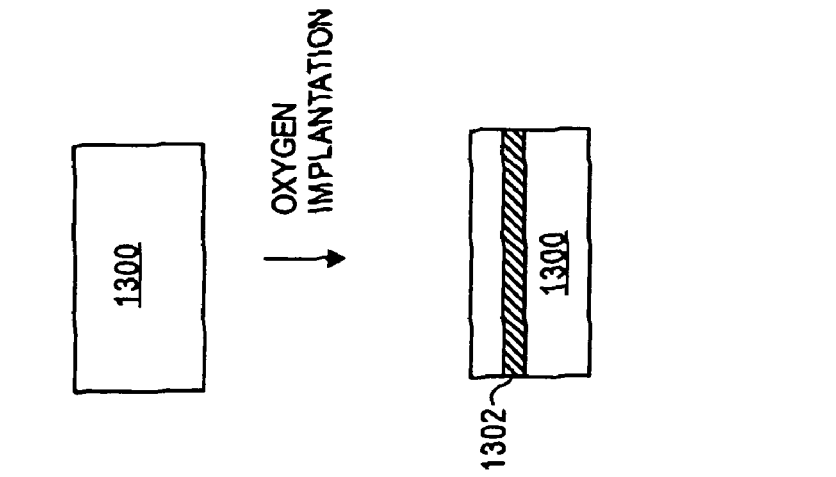
FIGS. 11-13 illustrate exemplary methods of forming a high mobility silicon substrate for a tri-gate device in accordance to an embodiment of the present invention.
Figure 12:
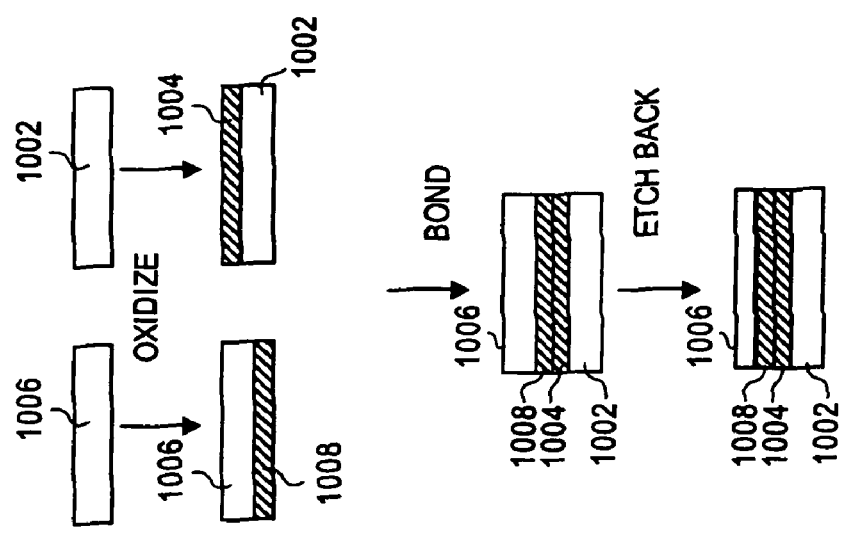
Figure 11:
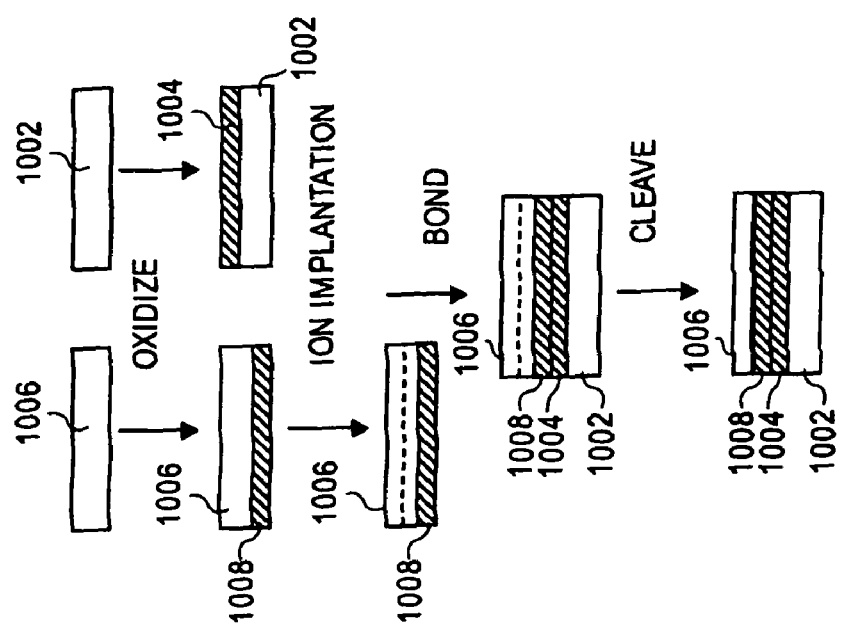

In other embodiments, instead of rotating the device substrate 1006 relative to the substrate 1002 as illustrated in FIGS. 11-12 or realigning the device substrate 1300 as discussed in FIG. 13, the device substrate for the non-planar device can be made so that the notch is relocated. The notch for the wafer used to form the device substrate thus is relocated to a <100> crystal plane location. When the device substrate has to be rotated, the mechanical rotation will dictate the reliability, accuracy, and/or repeatability of the rotation of the device substrate. For example, when the substrate 1006 and the substrate 1002 are offset to each other by 45 degrees or –45 degrees with respect to offsetting the notch on each wafer, the accuracy of the offset may be affected by the accuracy of the wafer bonding process or equipment. Thus, the mechanical rotation of the substrate 1006 with respect to the substrate 1002 may dictate the degrees of the offset (for example, by a few degrees). To minimize the potential for misalignment, the device substrate 1006 or the substrate 1300 can be created with the notch at the <100> crystal plane location (as opposed to the <100> location). As illustrated in FIG. 14A, an ingot 1400 that is used to later form the device substrate 1006 or the substrate 1300 can be formed with a reference line 1402 created at a <100> crystal plane location using X-Ray Diffraction, which has a much more accurate mechanical rotation than that of the wafer bonding process. When the ingot 1400 is spliced to generate a plurality of wafers 1406, which can be used to form substrates 1006 or 1300, each wafer 1406 will have a notch 1404 located at a <100> crystal plane location.

Figure 14B:
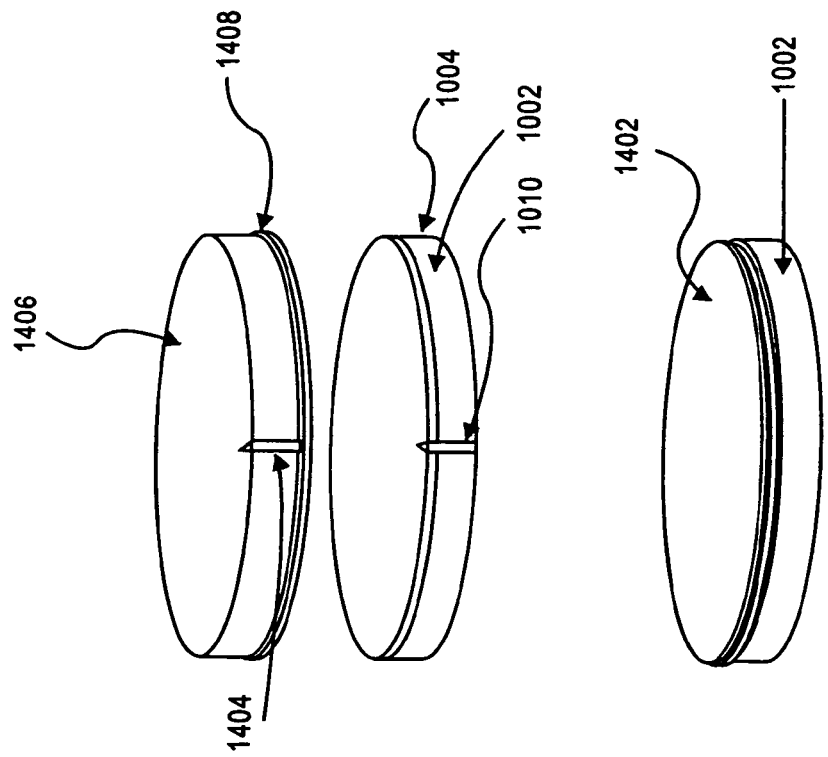
FIG. 14B illustrates the bonding of a wafer having a <100> reference notch to a wafer having a <110> reference notch.
Figure 14A:
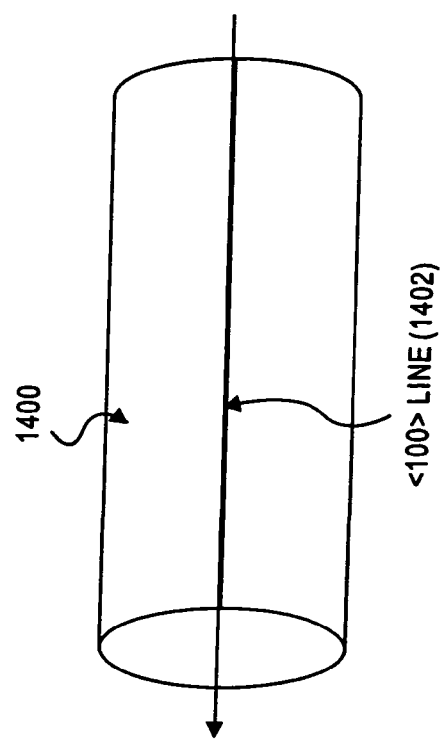
FIG. 14A illustrates an exemplary silicon ingot with a <100> reference notch.

In FIG. 14B, the wafer 1406 is bonded to another wafer, the substrate 1002, in one embodiment, to create the SOI substrate. The wafer 1404 may include insulating layer 1408 and the substrate 1002 may include the insulating layer 1004 as previously discussed. As before, the substrate 1002 includes a notch 1010 created at the <110> crystal plane location as previously discussed. The wafer 1406, however, has the notch 1404 located at the <100> crystal plane location. The notches 1404 and 1010 are aligned over each other during processing as shown in FIG. 14B. There is no need to rotate the wafer 1406 to realign the crystal structure of the wafer 1406 during processing. The wafer 1406 will have the 45 degrees or –45 degrees offset due to the relocation of the notch 1404 to the <100> crystal plane location to realign the crystal plane structure in the wafer 1404. The relocation of the notch 1404 to the <100> crystal plane allow the non-planar device formed in the wafer 1406 to have all sides having the <100> crystal plane desirable for high mobility.

Figure 15A:
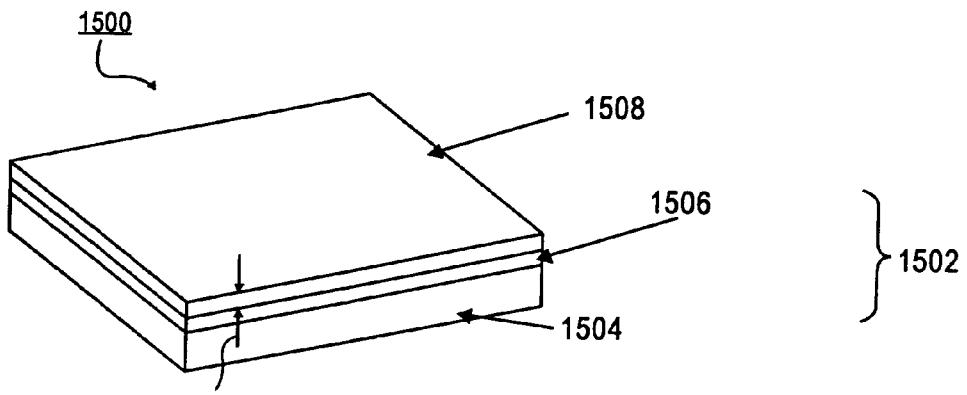
Figure 15B:
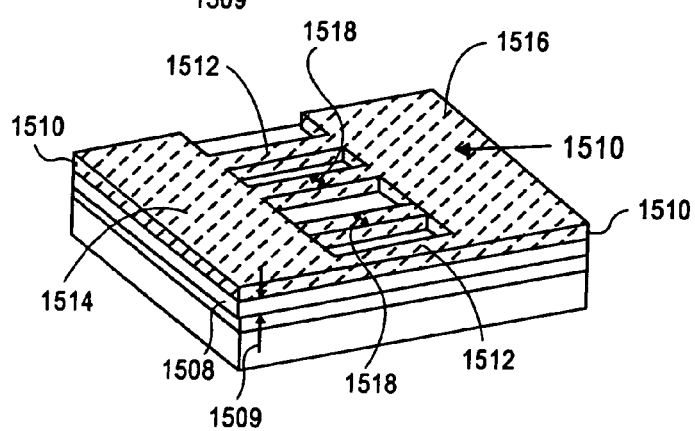
Figure 15C:
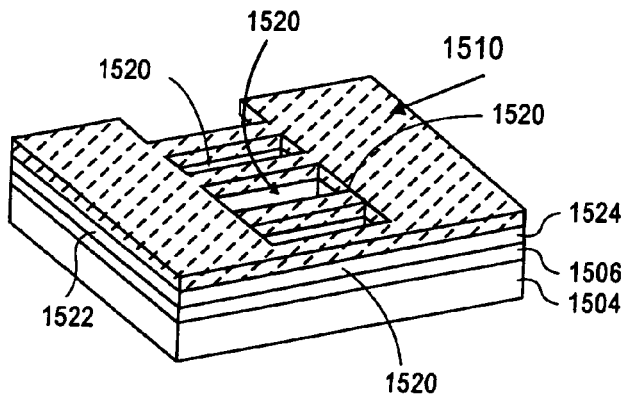
Figure 15D:
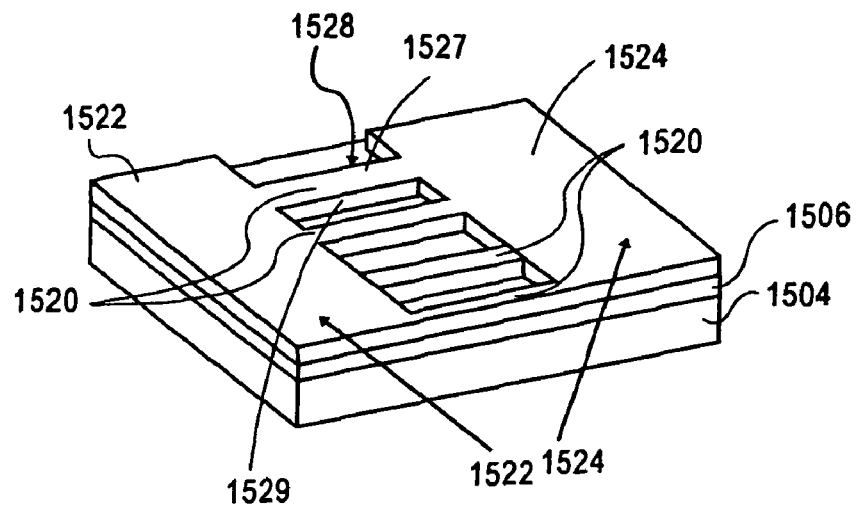
Figure 15E:
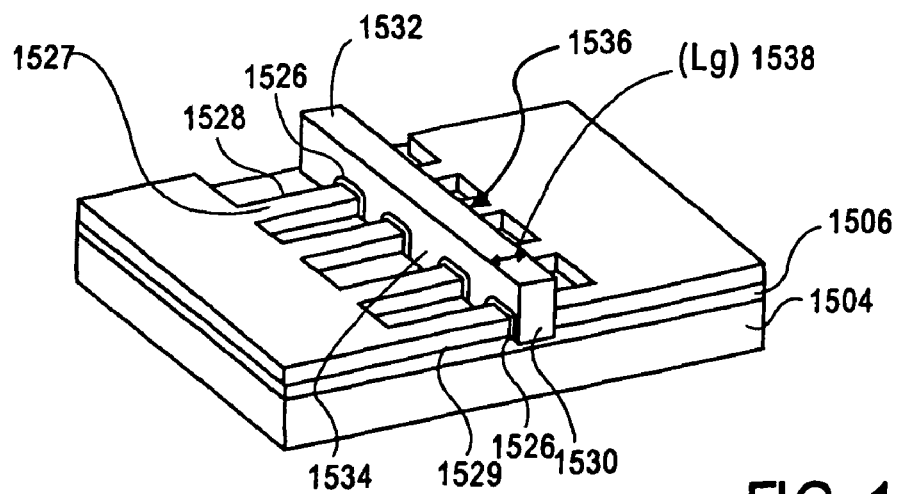
Figure 15F:
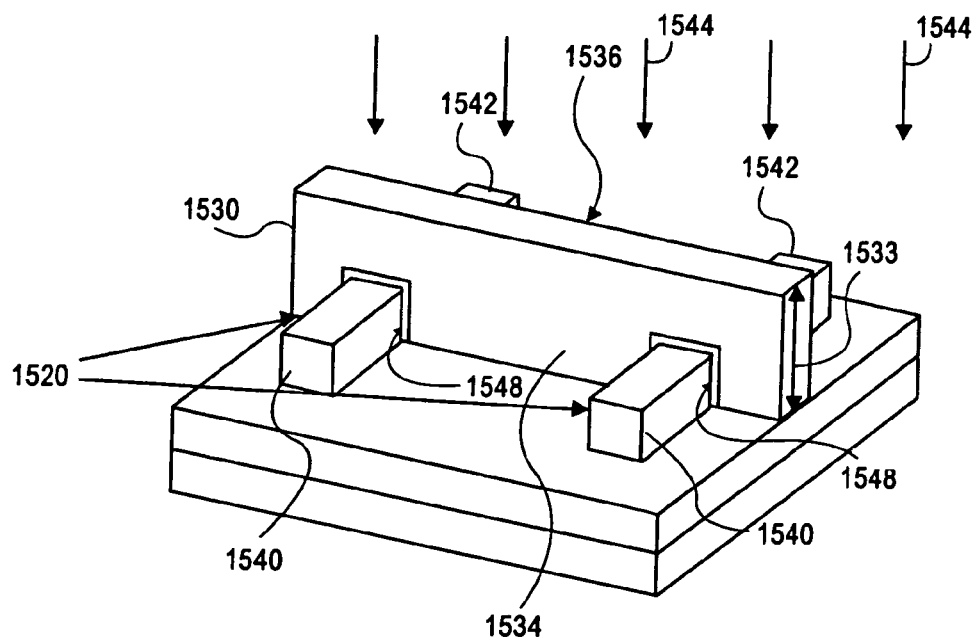
Figure 15G:
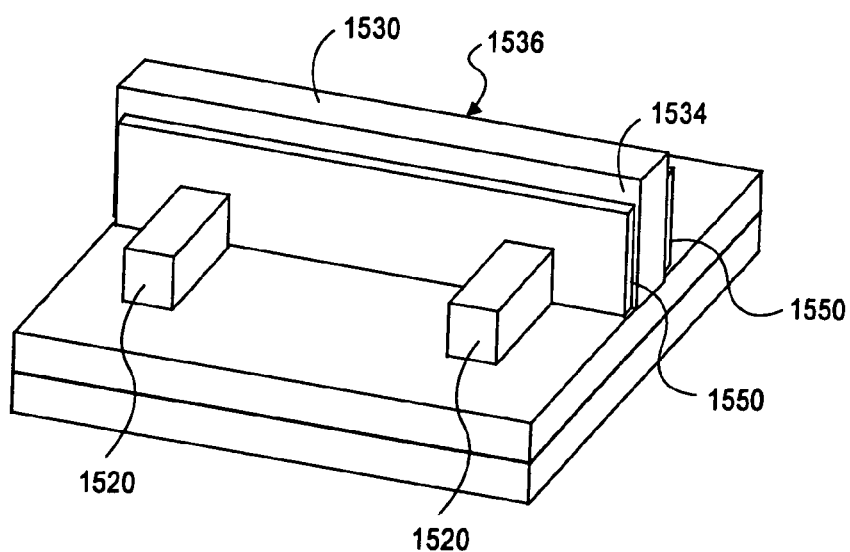
Figure 15J:
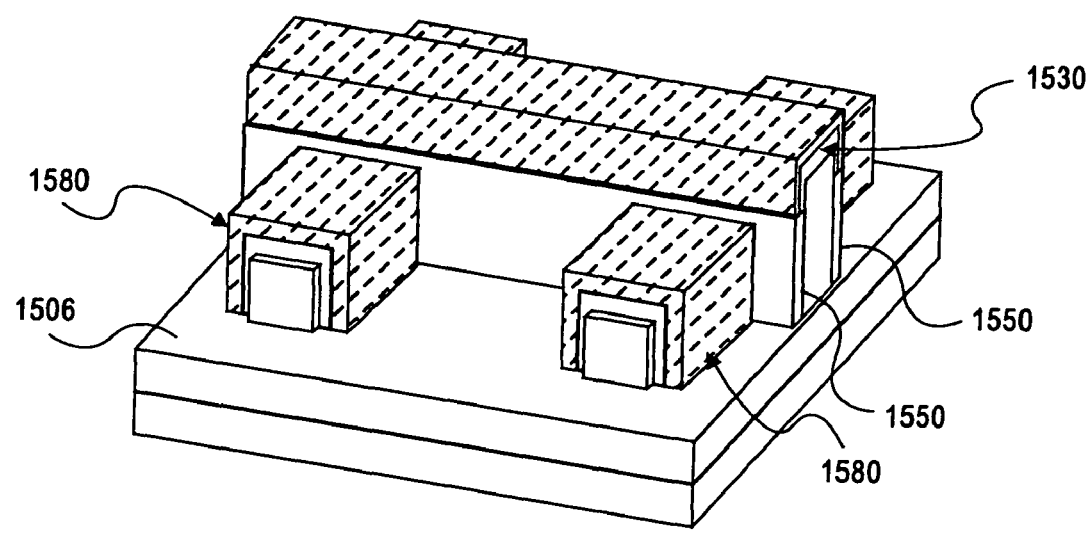

FIGS. 15A-15J illustrate an exemplary method of making a non-planar device or devices 1500 (e.g., tri-gate transistors) in accordance with embodiments of the present invention. In FIG. 15A, a substrate 1502 is provided. The substrate 1502 includes a semiconductor substrate 1504 (e.g., bulk silicon) and an insulating film 1506 (e.g., silicon dioxide). Upon the insulating film 1506, a device semiconductor substrate 1508 (e.g., monocrystalline silicon) is formed. Together, the substrate 1502 and the device substrate 1508 are referred to as the SOI substrate previously described. The device substrate 1508, in one embodiment, has a notch (not shown) created at a <100> crystal plane location and the substrate 1502 has a notch (not shown) created at a <110> crystal plane location. The notches are aligned over each other as previously discussed. In an alternative embodiment, the device substrate 1508 and the substrate 1502 both have a notch created at the <110> crystal plane location. When bonded together to form the SOI substrate, the device substrate 1508 is rotated by 45 degree (or –45 degrees) so that the notches are offset to each other as previously discussed. Isolation regions (not shown) can be formed into the device substrate 1508 in order to isolate the various transistors to be formed therein from one another. Isolation regions can be formed by etching away portions of the device substrate 1508 surrounding a tri-gate transistor, by for example well-known photolithographic and etching techniques, and then back filling the etched regions with an insulating film, such as $SiO_2$.

Next, a photoresist mask 1510 is formed on the device substrate 1508 as shown in FIG. 5B. The photoresist mask 1510 contains a pattern or plurality of patterns 1512 defining locations where semiconductor bodies or fins 1520 for the devices 1500 will be subsequently formed. The photoresist pattern 1512 defines the width 1518 desired of the subsequently formed semiconductor bodies 1520. In an embodiment of the present invention, the pattern 1512 define bodies 1520 having a width 1518 which is equal to or greater than the width desired of the gate length (Lg) of the fabricated transistor. In this way, the most stringent photolithography constraints used to fabricate the transistor are associated with the gate electrode patterning and not the semiconductor body or fin definition. In an embodiment of the present invention, the bodies 1520 will have a width 1518 less than or equal to 30 nanometers and ideally less than or equal to 20 nanometers. In an embodiment of the present invention, the patterns 1512 for the bodies 1520 have a width 1518 approximately equal to the silicon body height 1509. In an embodiment of the present invention, the photoresist patterns 1512 have a width 1518 which is between ½ the semiconductor body height 1509 and two times the semiconductor body height 1509.

The photoresist mask 1510 can also include patterns 1514 and 1516 for defining locations where source landing pads 1522 and drain landing pads 1524 are to be formed. The landing pads can be used to connect together the various source regions and to connect together the various drain regions of the fabricated transistor. The photoresist mask 1510 can be formed by well-known photolithographic techniques including masking, exposing, and developing a blanket deposited photoresist film.

Next, the device substrate 1508 is etched in alignment with photoresist mask 1510 to form one or more silicon bodies or fins and source and drain landing pads (if desired) as shown in FIG. 5C. The substrate 1508 is etched until the underlying buried oxide layer 1506 is exposed. Well-known semiconductor etching techniques, such as anisotropic plasma etching or reactive ion etching can be used to etch the substrate 1508.

Next, the photoresist mask 1510 is removed by well-known techniques, such as by chemical stripping and $O_2$ ashing, to produce the substrate shown in FIG. 5D.

Next, a gate dielectric layer 1526 is formed on and around each semiconductor body 1520. A gate dielectric layer 1526 is formed on the top surface 1527 as well as on the laterally opposite sidewalls 1528 and 1529 of each of the semiconductor bodies 1520. The gate dielectric can be a deposited dielectric or a grown dielectric. In an embodiment of the present invention, the gate dielectric layer 1526 is a silicon dioxide dielectric film grown with a dry/wet oxidation process. In an embodiment of the present invention, the silicon oxide film is grown to a thickness of between 5-15 Å. In an embodiment of the present invention, the gate dielectric film 1526 is a deposited dielectric, such as but not limited to a high dielectric constant film, such as metal oxide dielectric, such as tantalum pentaoxide ($Ta_2O_5$) and titanium oxide ($TiO_2$) or other high-K dielectrics, such as PZT. A high dielectric constant film can be formed by any well-known technique, such as by chemical vapor deposition (CVD).

Next, as shown in FIG. 5E, a gate electrode 1530 is formed. The gate electrode 1530 is formed on the gate dielectric layer 1526 formed on the top surface 1527 and on or adjacent to the sidewalls 1528 and 1529 of each of the semiconductor bodies 1520. The gate electrode 1530 has a top surface 1532 opposite of bottom surface formed on the insulating substrate 1502 and has a pair of laterally opposite sidewalls 1534 and 1536. The distance between the laterally opposite sidewalls 1534 and 1536 define the gate length (Lg) 1538 of the tri-gate transistor. The gate electrode 1530 can be formed by blanket depositing a suitable gate electrode material over the substrate shown in FIG. 5D. The gate electrode can be formed to a thickness 1533 (FIG. 5F) between 200-9000 Å. In an embodiment, the gate electrode has a thickness or height 1533 of at least three times the height 1509 of semiconductor bodies 1520. The gate electrode material is then patterned with well-known photolithography and etching techniques to form the gate electrode 1530 from the gate electrode material. The gate electrode material may comprise polycrystalline silicon, polycrystalline silicon germanium alloy, and metal, such as tungsten, tantalum, and their nitrides. In an embodiment of the present invention, the gate electrode 1530 has the gate length 1538 of less than or equal to 30 nanometers and ideally less than or equal to 20 nanometers.

Next, source 1540 and drain 1542 regions for the transistor are formed in semiconductor body 1520 on opposite sides of the gate electrode 1530. In an embodiment of the present invention, the source 1540 and drain 1542 regions include tip or source/drain extension regions. The source and drain regions and extensions can be formed by placing dopants 1544 into semiconductor bodies 1520 on both sides 1534 and 1536 of gate electrode 1530. If source and drain landing pads are utilized, they may be doped at this time also. For a PMOS tri-gate transistor, the semiconductor fins or bodies 1520 are doped to a p type conductivity and to a concentration between $1\times10^{20}$-$1\times10^{21}$ atoms/cm$^3$. For a NMOS tri-gate transistor, the semiconductor fins or bodies 1520 is doped with n type conductivity ions to a concentration between $1\times10^{20}$-$1\times10^{21}$ atoms/cm$^3$. In an embodiment of the present invention, the silicon films are doped by ion-implantation. In an embodiment of the present invention, the ion-implantation occurs in a vertical direction as shown in FIG. 5F. When the gate electrode 1530 is a polysilicon gate electrode, it can be doped during the ion-implantation process. The gate electrode 1530 acts as a mask to prevent the ion-implantation step from doping the channel region(s) 1548 of the tri-gate transistor. The channel region 1548 is the portion of the silicon body 1520 located beneath or surrounded by the gate electrode 1530. If the gate electrode 1530 is a metal electrode, a dielectric hard mask maybe used to block the doping during the ion-implantation process. In other embodiments, other methods, such as solid source diffusion, may be used to dope the semiconductor body to form source and drain extensions.

Next, if desired, the substrate shown in FIG. 5F can be further processed to form additional features, such as heavily doped source/drain contact regions, deposited silicon on the source and drain regions as well as the gate electrode, and the formation of silicide on the source/drain contact regions as well as on the gate electrode. For examples, dielectric sidewall spacers 1550 (FIG. 5G) can be formed on the sidewalls of the gate electrode 1530; semiconductor films 1560 and 1562 (FIG. 5H) can be formed on the exposed surfaces of the body 1520 for certain applications (e.g., for forming raised source and drain regions); additional doping can be performed (e.g., to form the raised source and drain regions) (FIG. 5I); and a refractory metal silicide 1580 can be formed on the source and drain regions and/or on the gate electrode 1530 (FIG. 5J). Techniques for forming these components are known in the art.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. A high mobility semiconductor assembly comprising:
   a first substrate having a first reference orientation located at a <110> crystal plane location on the first substrate;
   a second substrate formed on top of the first substrate, the second substrate having a second reference orientation located at a <100> crystal plane location on the second substrate,
   wherein the first reference orientation is aligned with the second reference orientation;
   a non-planar device having a top surface and laterally opposite sidewalls formed in the second substrate, wherein each of the top surface and the laterally opposite sidewalls has a <100> crystal plane;
   a gate dielectric formed on the top au ace and on the laterally opposite sidewalls;
   a gate electrode formed adjacent the gate dielectric formed on the top of surface and on the laterally opposite sidewalls; and
   a pair of source/drain regions formed on opposite sides of the gate electrode.

2. The high mobility semiconductor assembly of claim 1 wherein the non-planar device is a PMOS transistor.

3. The high mobility semiconductor assembly of claim 2 further comprising a non-planar NMOS transistor comprising:
   a top surface and laterally opposite sidewalls formed in the second substrate, wherein each of the top surface and the laterally opposite sidewalls of the non-planar NMOS transistor has a <100> crystal plane;
   a gate dielectric formed on the top surface and on the laterally opposite sidewalls;
   a gate electrode formed adjacent the gate dielectric formed on the top of surface and on the laterally opposite sidewalls; and
   a pair of source/drain regions formed on opposite sides of the gate electrode.

4. The high mobility semiconductor assembly of claim 3 wherein the non-planar NMOS transistor and non-planar PMOS transistor are aligned.

5. The high mobility semiconductor assembly of claim 1 wherein the first substrate has a <100> crystal plane top surface and the second substrate has a <100> crystal plane top surface.

6. The high mobility semiconductor assembly of claim 5 wherein the non-planar device is a PMOS transistor.

7. The high mobility semiconductor assembly of claim 6 further comprising a non-planar NMOS transistor comprising:
   a top surface and laterally opposite sidewalls formed in the second substrate, wherein each of the top surface and the laterally opposite sidewalls of the non-planar NMOS transistor has a <100> crystal plane
a gate dielectric formed on the top surface and on the laterally opposite sidewalls;
a gate electrode formed adjacent the gate dielectric formed on the top of surface and on the laterally opposite sidewalls; and a pair of source/drain regions formed on opposite sides of the gate electrode.

8. The high mobility semiconductor assembly of claim 7 wherein the non-planar NMOS transistor and non-planar PMOS transistor are aligned.

* * * * *